United States Patent
Choi et al.

(10) Patent No.: US 11,568,916 B2
(45) Date of Patent: Jan. 31, 2023

(54) MULTI-PHASE CLOCK GENERATOR, MEMORY DEVICE INCLUDING MULTI-PHASE CLOCK GENERATOR, AND METHOD OF GENERATING MULTI-PHASE CLOCK OF MEMORY DEVICE

(71) Applicant: SAMSUNG ELECTRONICS CO., LTD., Suwon-si (KR)

(72) Inventors: Hundae Choi, Hwaseong-si (KR); Garam Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/811,503

(22) Filed: Jul. 8, 2022

(65) Prior Publication Data

US 2022/0343965 A1    Oct. 27, 2022

Related U.S. Application Data

(63) Continuation of application No. 17/139,538, filed on Dec. 31, 2020, now Pat. No. 11,437,085.

(30) Foreign Application Priority Data

May 14, 2020    (KR) .................. 10-2020-0057543

(51) Int. Cl.
*G11C 11/4076* (2006.01)
*H03L 7/081* (2006.01)
*H03L 7/085* (2006.01)

(52) U.S. Cl.
CPC .......... *G11C 11/4076* (2013.01); *H03L 7/085* (2013.01); *H03L 7/0816* (2013.01); *H03L 7/0818* (2013.01)

(58) Field of Classification Search
CPC . G11C 11/4076; H03L 7/0816; H03L 7/0818; H03L 7/085
See application file for complete search history.

(56) References Cited

U.S. PATENT DOCUMENTS 3,840,821 A * 10/1974 Conway ................. H03L 7/085
                                                              331/25
6,522,983 B1 * 2/2003 Dobos .................... G01R 13/02
                                                              702/89

(Continued)

FOREIGN PATENT DOCUMENTS

CN        1619966         5/2005
CN     100566171 C  * 12/2009  ........... H03K 5/1565

(Continued)

OTHER PUBLICATIONS

Notice of Allowance dated Apr. 20, 2022 in corresponding U.S. Appl. No. 17/139,538.

(Continued)

*Primary Examiner* — Adam D Houston
(74) *Attorney, Agent, or Firm* — F. Chau & Associates, LLC

(57) ABSTRACT

A multi-phase clock generator includes first and second variable delay lines, a first phase splitter configured to phase-split a first phase-delayed clock, output from a clock tree, to output a first divided clock and a third divided clock, a second phase splitter configured to phase-split a second phase-delayed clock, output from the clock tree, to output a second divided clock and a fourth divided clock, a first duty cycle detector configured to detect a first duty error between the first divided clock and the third divided clock, and a second duty cycle detector configured to detect a second duty error between the second divided clock and the fourth divided clock. The first variable delay line is controlled (Continued)

according to the first duty error, and the second variable delay line is controlled according to the second duty error.

20 Claims, 15 Drawing Sheets

(56) References Cited

U.S. PATENT DOCUMENTS

| | | | |
|---|---|---|---|
| 6,539,072 B1 | 3/2003 | Donnelly et al. | |
| 6,639,476 B1* | 10/2003 | Sullivan | H03L 7/085 331/17 |
| 6,897,693 B2 | 5/2005 | Kim | |
| 6,900,681 B2 | 5/2005 | Takano | |
| 7,545,190 B2 | 6/2009 | Chiang et al. | |
| 7,825,710 B2 | 11/2010 | Kim et al. | |
| 9,225,324 B2 | 12/2015 | Arcudia et al. | |
| 10,026,462 B1* | 7/2018 | Ma | G11C 7/1093 |
| 10,056,909 B1* | 8/2018 | Qi | H03L 7/0818 |
| 11,139,019 B1* | 10/2021 | Satoh | H03L 7/0812 |
| 11,264,994 B1* | 3/2022 | Kim | H03K 5/133 |
| 11,437,085 B2* | 9/2022 | Choi | G11C 16/32 |
| 2003/0218486 A1* | 11/2003 | Kwak | H03L 7/087 327/158 |
| 2003/0219088 A1* | 11/2003 | Kwak | H03L 7/0816 375/376 |
| 2004/0095174 A1* | 5/2004 | Hong | H03L 7/0816 327/175 |
| 2005/0140422 A1* | 6/2005 | Klemmer | H03F 3/005 327/337 |
| 2006/0001465 A1* | 1/2006 | Kwak | H03L 7/0814 327/160 |
| 2006/0017480 A1* | 1/2006 | Lin | H03L 7/0816 327/158 |
| 2006/0057996 A1* | 3/2006 | Petrovic | H03D 3/007 455/260 |
| 2006/0197565 A1* | 9/2006 | Kang | H03L 7/0814 327/158 |
| 2007/0030754 A1* | 2/2007 | Gomm | H03L 7/0818 365/233.13 |
| 2007/0189417 A1* | 8/2007 | Waheed | H03C 5/00 375/300 |
| 2007/0189431 A1* | 8/2007 | Waheed | H03C 3/0991 375/376 |
| 2007/0200604 A1 | 8/2007 | Yun et al. | |
| 2008/0036509 A1 | 2/2008 | Jang | |
| 2008/0164920 A1* | 7/2008 | Cho | H03L 7/0816 327/158 |
| 2008/0174350 A1* | 7/2008 | Shin | H03L 7/0816 327/158 |
| 2008/0239846 A1 | 10/2008 | Ku | |
| 2009/0146708 A1 | 6/2009 | Yun et al. | |
| 2009/0179675 A1 | 7/2009 | Lee et al. | |
| 2010/0052745 A1 | 3/2010 | Chung et al. | |
| 2010/0109725 A1 | 5/2010 | Yun et al. | |
| 2010/0295588 A1 | 11/2010 | Choi | |
| 2011/0102035 A1 | 5/2011 | Lee et al. | |
| 2011/0316599 A1 | 12/2011 | Kwak | |
| 2013/0249618 A1 | 9/2013 | Kwak et al. | |
| 2014/0269120 A1 | 9/2014 | Na | |
| 2016/0182063 A1 | 6/2016 | Seo et al. | |
| 2016/0269012 A1* | 9/2016 | Takahashi | H03L 7/087 |
| 2016/0373119 A1* | 12/2016 | Wei | G11C 7/1093 |
| 2017/0288683 A1* | 10/2017 | Wei | H03L 7/0814 |
| 2018/0123601 A1* | 5/2018 | Jeon | G11C 7/222 |
| 2019/0181848 A1* | 6/2019 | Kim | G11C 29/028 |
| 2020/0059226 A1 | 2/2020 | Choi et al. | |
| 2020/0106429 A1* | 4/2020 | Doppalapudi | H03K 5/1565 |
| 2021/0006254 A1* | 1/2021 | Kim | H03L 7/18 |
| 2021/0217457 A1* | 7/2021 | Satoh | H03L 7/0814 |
| 2021/0358534 A1* | 11/2021 | Choi | H03L 7/22 |
| 2022/0084616 A1* | 3/2022 | Choi | G11C 29/50012 |
| 2022/0094339 A1* | 3/2022 | Kim | H03K 5/01 |

FOREIGN PATENT DOCUMENTS

| | | | |
|---|---|---|---|
| CN | 113890533 | 1/2022 | |
| CN | 113890533 A * | 1/2022 | G11C 11/4076 |
| KR | 1020070084784 | 8/2007 | |
| KR | 10-0763849 | 9/2007 | |
| KR | 20080001124 A * | 1/2008 | |
| KR | 1020080001124 | 1/2008 | |
| KR | 1020080088158 | 10/2008 | |
| KR | 1020090060603 | 6/2009 | |
| KR | 1020090076489 | 7/2009 | |
| KR | 1020090078222 | 7/2009 | |
| KR | 1020100027267 | 3/2010 | |
| KR | 1020100048503 | 5/2010 | |
| KR | 1020100125654 | 12/2010 | |
| KR | 1020110046984 | 5/2011 | |
| KR | 20170112674 A * | 10/2017 | |
| KR | 1020170112674 | 10/2017 | |
| TW | I315070 | 9/2009 | |

OTHER PUBLICATIONS

Office Action dated Jun. 25, 2021 in corresponding TW Application No. 110104713.

* cited by examiner

MULTI-PHASE CLOCK GENERATOR, MEMORY DEVICE INCLUDING MULTI-PHASE CLOCK GENERATOR, AND METHOD OF GENERATING MULTI-PHASE CLOCK OF MEMORY DEVICE

CROSS-REFERENCE TO RELATED APPLICATION(S)

This U.S. non-provisional patent application is a continuation of U.S. patent application Ser. No. 17/139,538 filed Dec. 31, 2020, which claims benefit of priority under 35 U.S.C. 119(a) to Korean Patent Application No. 10-2020-0057543 filed on May 14, 2020 in the Korean Intellectual Property Office, the disclosure of which is incorporated by reference in its entirety herein.

1. Technical Field

Exemplary embodiments of the present disclosure relate to a multi-phase clock generator, a memory device including the multi-phase clock generator, and a method of generating a multi-phase clock of the memory device.

2. Discussion of Related Art

In an input/output (I/O) interfacing method that synchronizes data with a clock signal and transmits the synchronized data between a memory and a memory controller in a system, it is important to correctly synchronize the data with the clock signal. Since a dynamic random access memory (DRAM) operates at a high speed, the DRAM may synchronize data with a clock signal using a delay locked loop (DLL) circuit. The DLL circuit includes a coarse delay line having a high delay resolution and a fine delay line having a low delay resolution.

SUMMARY

Exemplary embodiments of the inventive concept provide a multi-phase clock generator, a memory device including the multi-phase clock generator, and a method of generating a multi-phase clock of the memory device.

Exemplary embodiments of the inventive concept provide a multi-phase clock generator which may be implemented in a small area, a memory device including the multi-phase clock generator, and a method of generating a multi-phase clock of the memory device.

According to an exemplary embodiment of the inventive concept, a multi-phase clock generator includes: a first variable delay line, a second variable delay line, a fixed delay line, a delay line controller, a phase controller, a clock tree, a first phase splitter, a second phase splitter, a first duty cycle detector, and a second duty cycle detector. The first variable delay line is receiving a reference clock and generating a delayed clock. The second variable delay line is receiving the delayed clock and generating a second phase-delayed clock. The fixed delay line is for receiving the delayed clock and generating a first phase-delayed clock. The delay line controller is configured to control the first variable delay line according to a first phase difference between a reference clock and a feedback clock. The phase controller is configured to control the second variable delay line according to a second phase difference between the delayed clock and the second phase-delayed clock. The clock tree is configured to receive the first phase-delayed clock and the second phase-delayed clock. The first phase splitter is configured to phase-split the first phase-delayed clock, output from the clock tree, to output a first divided clock and a third divided clock. The second phase splitter is configured to phase-split the second phase-delayed clock, output from the clock tree, to output a second divided clock and a fourth divided clock. The first duty cycle detector is configured to detect a first duty error between the first divided clock and the third divided clock. The second duty cycle detector is configured to detect a second duty error between the second divided clock and the fourth divided clock. The first variable delay line is controlled according to the first duty error, and the second variable delay line is controlled according to the second duty error.

According to an exemplary embodiment of the inventive concept, a memory device including a multi-phase clock generator includes: a delay locked loop circuit, a clock tree, a fixed delay lube, a second variable delay line, a phase controller, a first phase splitter, a second phase splitter, a first duty cycle detector, and a second duty cycle detector. The delay locked loop circuit is configured to receive a reference clock and to output a delayed clock. The clock tree is configured to receive the delayed clock and to output the delayed clock. The fixed delay line is for receiving the delayed clock and outputting a first phase-delayed clock. The second variable delay line is for phase-shifting the delayed clock to generate a second phase-delayed clock. The phase controller is configured to control the second variable delay line according to a second phase difference between the delayed clock and the second phase-delayed clock. The first phase splitter is configured to phase-split the first phase-delayed clock to output a first divided clock and a third divided clock. The second phase splitter is configured to phase-split the second phase-delayed clock to output a second divided clock and a fourth divided clock. The first duty cycle detector is configured to detect a first duty error between the first divided clock and the third divided clock. The second duty cycle detector is configured to detect a second duty error between the second divided clock and the fourth divided clock. The delay locked loop circuit is controlled according to the first duty error, and the second variable delay line is controlled according to the second duty error.

According to an exemplary embodiment of the inventive concept, a method of generating a multi-phase clock of a memory device includes: starting a delay locked loop operation to receive a reference clock and to generate a delayed clock; performing a coarse locking operation on the reference clock; determining whether the coarse clocking operation is finished; performing a fine locking operation while performing a first duty error correction operation between a first divided clock and a third divided clock, corresponding to the delayed clock, when the coarse clock locking operation is finished; phase-splitting at least one phase-delayed clock generated based the delayed clock to generate a phase-split clock; and performing a second duty error correction operation between a second divided clock and a fourth divided clock corresponding to the phase-split clock.

BRIEF DESCRIPTION OF DRAWINGS

The present disclosure will be more clearly understood from the following detailed description, taken in conjunction with the accompanying drawings.

DETAILED DESCRIPTION OF THE EXEMPLARY EMBODIMENTS

Hereinafter, exemplary embodiments of the inventive concept will be described with reference to the accompanying drawings.

In a multi-phase clock generator according to an exemplary embodiment of the inventive concept, a memory device including the multi-phase clock generator, and a method of generating a multi-phase clock of the memory device, a 90-degree phase clock is generated from an output of a delay locked loop (DLL), a duty of the generated 90-degree clock and a duty of the DLL is compensated, and a multi-phase clock is generated through a phase split.

Figure 1:
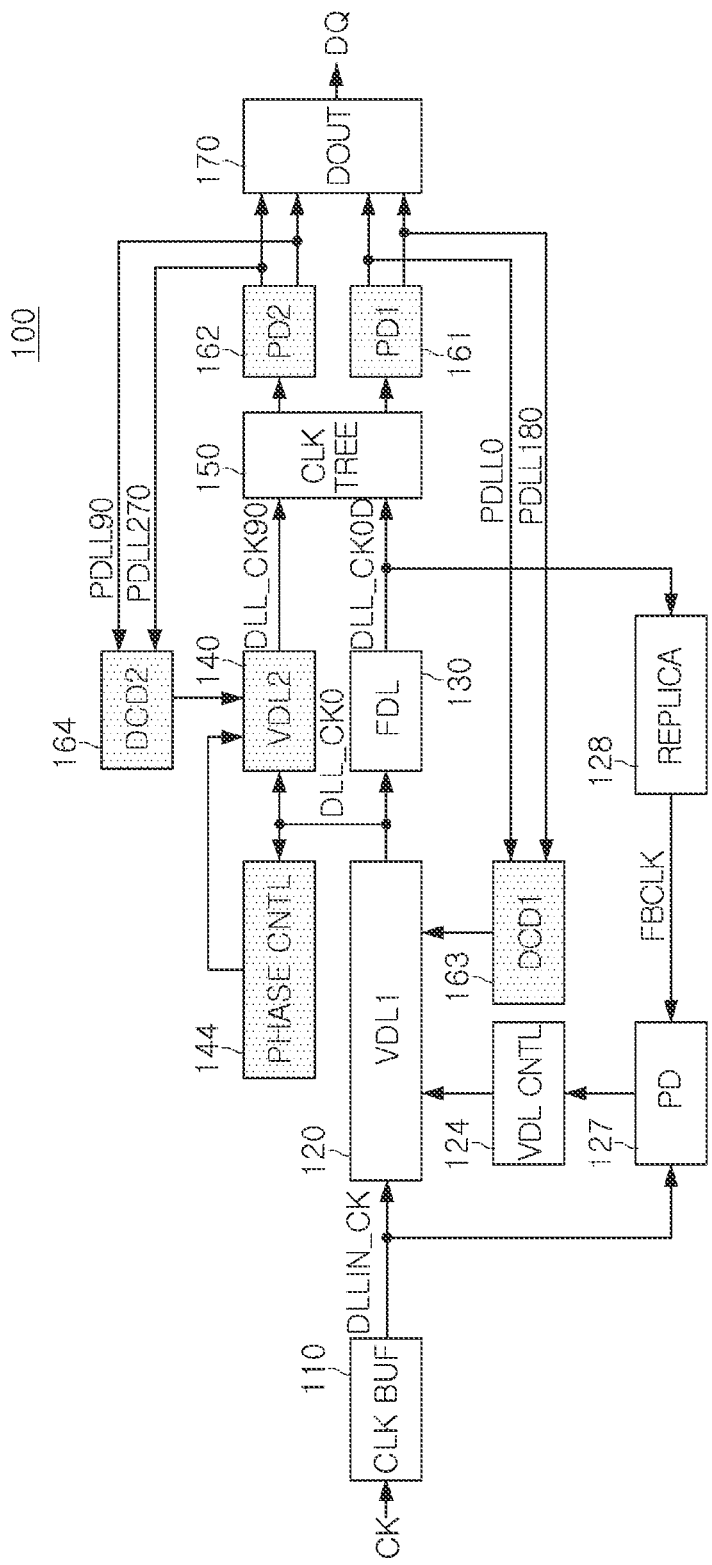
FIG. 1 is a block diagram of a multi-phase clock generator according to an exemplary embodiment of the inventive concept.

FIG. 1 is a schematic block diagram of a multi-phase clock generator 100 according to an exemplary embodiment of the inventive concept.

Referring to FIG. 1, the multi-phase clock generator 100 includes a clock buffer (CLK BUF) 110 (e.g., a buffer circuit), a first variable delay line (VDL1) 120, a delay line controller (VDL CNTL) 124 (e.g., a control circuit), a phase detector (PD) 127 (e.g., phase detection circuit), a replica 128, a fixed delay line (FDL) 130, a second variable delay line (VDL2) 140, a phase controller (PHASE CNTL) 144 (e.g., a control circuit), a clock tree (CLK TREE) 150, first phase splitters (PS1) 161, a second phase splitter (PS2) 162, a first duty cycle detector (DCD1) 163 (e.g., a detector circuit), a second duty cycle detector (DCD2) 164 (e.g., a detector circuit), and an output buffer 170 (e.g., buffer circuit).

The multi-phase clock generator 100 receives an input clock CK (e.g., a clock signal), generates a reference clock DLLIN_CLK from the input clock CK, and divides a frequency of the reference clock DLLIN_CLK to generate first to fourth frequency divided clocks PDLL0, PDLL90, PDLL180, and PDLL270 having a phase difference of 90 degrees from each other.

The clock buffer (CLK BUF) 110 may buffer an external clock CK to generate the reference clock DLLIN_CK.

The first variable delay line (VDL1) 120 receives the reference clock DLLIN_CK from the clock buffer 110 and delays the reference clock DLLIN_CK according to a first phase difference or a first duty error to output a delayed clock DLL_CK0. The first phase difference may include a phase difference between the reference clock DLLIN_CK and a delayed clock DLL_CK0D of a fixed delay line 130. The first duty error may be a duty error between the first and third divided clocks PDLL0 and PDLL180. However, the phase difference and duty error are not limited thereto.

In an embodiment, the delay line controller (VDL CNTL) 124 controls the first variable delay line 120 according to a code value corresponding to the phase difference. For example, the delay line controller 124 may determine ON/OFF of delay cells, constituting the first variable delay line 120, according to the code value to control a delay of the reference clock DLLIN_CK.

The phase detector (PD) 127 detects a phase between a feedback clock FBCLK and the reference clock DLLIN_CK.

The replica 128 may have substantially the same delay amount as a clock path delaying the reference clock DLLIN_CK. In an embodiment, the replica 128 delays a signal passing through it by a same amount as the first variable delay line (VDL1) delays the reference clock DLLIN_CK. In an exemplary embodiment, the replica 128 is implemented by a delay circuit.

The fixed delay line (FDL) 130 receives the delayed clock DLL_CK0 from the first variable delay line 120 and outputs the first phase-delayed clock DLL_CK0D.

The second variable delay line (VDL2) 140 receives the delayed clock DLL_CK0 from the first variable delay line 120, and outputs a second phase-delayed clock DLL_CK90 according to a phase control code value corresponding to the second phase or a second duty error. In an embodiment, the phase control code value is a value corresponding to a second phase difference between the delayed clock DLL_CK0 and the second phase-delayed clock DLL_CK90, and the second duty error is a duty error between the second and fourth frequency divided clocks PDLL90 and PDLL270. However, the phase difference and duty error are not limited thereto.

The phase controller (PHASE CNTL) 144 outputs a phase control code value corresponding to a phase difference between the delayed clock DLL_CK0 and the second phase-delayed clock DLL_CK90.

The clock tree (CLK TREE) 150 receives the first and second phase-delayed clocks DLL_CK0D and DLL_CK90. The first and second phase-delayed clocks DLL_CK0D and DLL_CK90 may be transmitted within a semiconductor memory device through internal paths. The clock tree 150 outputs the first phase-delayed clock DLL_CK0D to the first phase splitter (PS1) 161 and outputs the second phase-delayed clock DLL_CK90 to the second phase splitter (P52)_162.

The first phase splitter (PS1) 161 receives the first phase-delayed clock DLL_CK0D and performs a phase-split on the first phase-delayed clock DLL_CK0D to output the first and third divided clocks PDLL0 and PDLL180.

The second phase splitter (PS2) 162 receives the second phase-delayed clock DLL_CK90 and performs a phase-split the second phase-delayed clock DLL_CK90 to output the second and fourth divided clocks PDLL90 and PDLL270.

The first duty cycle detector (DCD1) 163 is configured to detect a first duty error between the first divided clock PDLL0 and the third divided clock PDLL180.

The second duty cycle detectors (DCD2) 164 is configured to detect a second duty error between the second divided clock PDLL90 and the fourth divided clock PDLL270.

The output buffer 170 may buffer the divided clocks PDLL0, PDLL90, PDLL180, and PDLL270, having different phases, output from the first and second phase splitters 161 and 162 and may output the buffered clocks PDLL0, PDLL90, PDLL180, and PDLL270 externally.

A multi-phase clock (for example, a 4-phase clock) is used to address an internal bandwidth limit of a memory device. Skew between such multi-phase clocks needs to be corrected. Previous multi-phase clock generators include complicated multi-phase detectors that occupy a large area and use a lot of power.

The multi-phase clock generator 100 according to an exemplary embodiment of the inventive concept is configured to correct a duty error of a 0 divided clock to compensate for skew between zero degrees and 180 degrees, and corrects a phase difference using a delay locked loop (DLL) to compensate for skew between zero degrees and 90 degrees. Thus, the multi-phase clock generator 100 may reduce power consumption and may be implemented with a less complex structure.

Each of the variable delay lines 120 and 140 according to an exemplary embodiment of the inventive concept includes a coarse delay line and a fine delay line.

Figure 2:
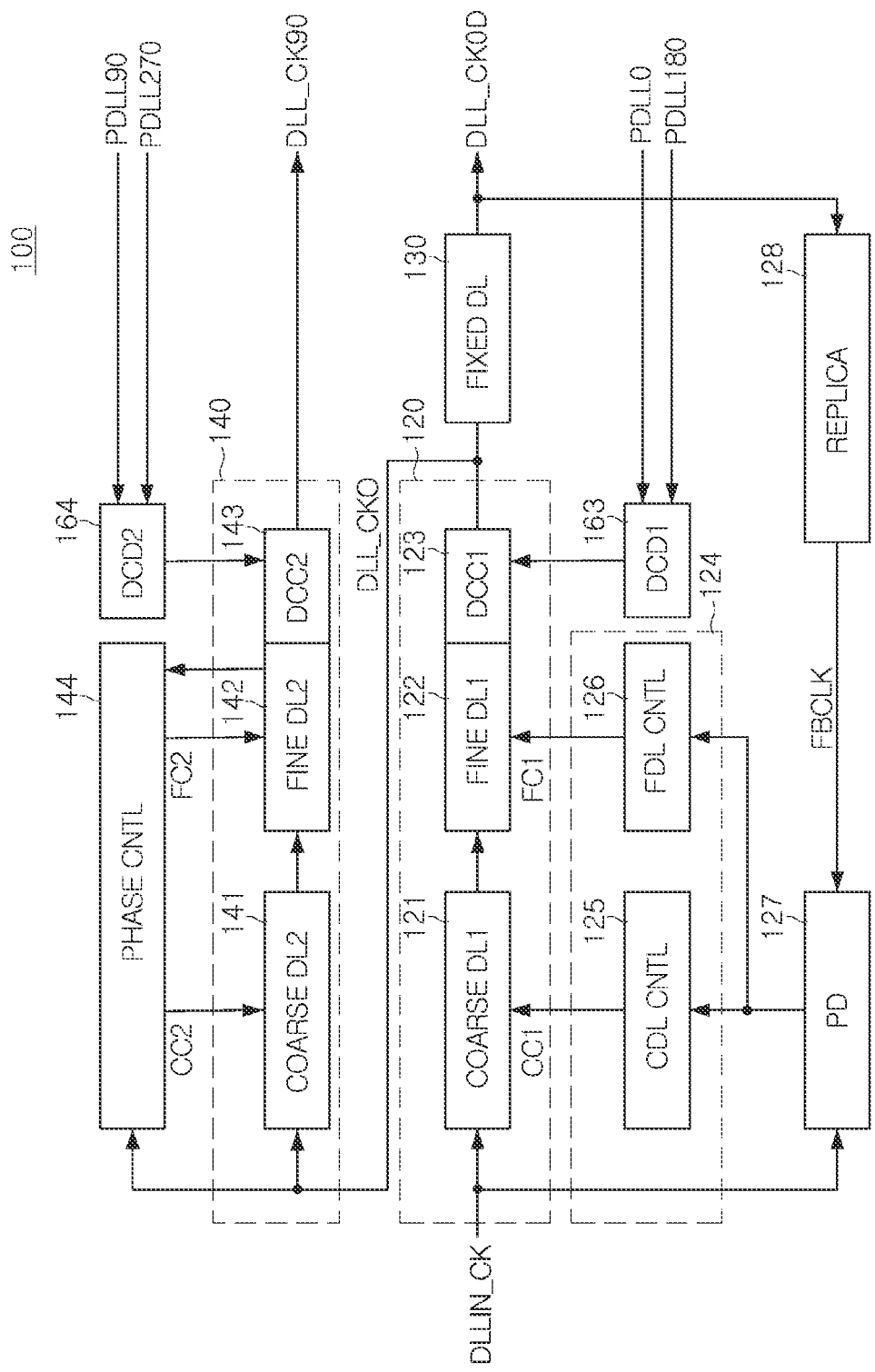
FIG. 2 is a detailed block diagram of first and second variable delay lines illustrated in FIG. 1.

FIG. 2 is a detailed block diagram of the first and second variable delay lines 120 and 140 illustrated in FIG. 1. Referring to FIG. 2, the first variable delay line 120 includes first coarse delay lines (COARSE DL1) 121, first fine delay lines (FINE DL1) 122, and first duty correction circuits (DCC1) 123.

In an embodiment, the first coarse delay line (COARSE DL1) 121 delays a reference clock DLLIN_CK using first coarse delay cells connected in series. Each of the first coarse delay cells may be turned on/off according to a first coarse code CC1. For example, a delay cell turned on according to the first coarse code CC1 has a first coarse delay amount. The cell turned on according to the first coarse code CC1 may be bypassed.

In an embodiment, the first fine delay line (FINE DL1) 122 delays a clock, output from the first coarse delay line 121, using the first fine delay cells. Each of the first fine delay cells may be turned on/off according to a first fine code FC1. For example, a delay cell turned on according to the first fine code FC1 has a first fine delay amount. The delay cell turned on according to the first fine code FC1 may be bypassed.

In an exemplary embodiment, the phase detector (PD) 127 detects a first phase difference between the reference clock DLLIN_CK and the feedback clock FBCLK. The delay line controller 124 may include a coarse delay line controller (CDL CNTL) 125 and a fine delay line controller (FDL CNTL) 126. The coarse delay line controller 125 generates a first coarse code CC1 corresponding to the first phase difference. The delay line controller 126 generates a first fine code PC1 corresponding to the first phase difference.

The first duty correction circuit (DCC1) 123 controls a clock, output from the first fine delay line 122, according to the first duty error. The first duty error may be output from the first duty cycle detectors (DCD1) 163. In an embodiment, the delay clock DLL_CK0 output from the first duty correction circuit 123 is transmitted to the fixed delay line 130 and the second variable delay line 140.

Continuing to refer to FIG. 2, the second delay line 140 includes a second coarse delay line (COARSE DL2) 141, a second fine delay line (FINE DL2) 142, and a second duty correction circuit (DCC2) 143.

In an embodiment, the second coarse delay line (COARSE DL2) 141 delays the delay clock DLL_CK0 using second coarse delay cells connected in series. In an embodiment, each of the second coarse delay cells is turned on/off according to the second coarse code CC2.

The second fine delay line (FINE DL2) 142 delays a clock, output from the second coarse delay line 141, using the second fine delay cells. In an embodiment, each of the second fine delay cells is turned on/off according to the second fine code FC2.

In an exemplary embodiment, the phase controller (PHASE CNTL) 144 generates the second coarse code CC2 and the second fine code FC2 corresponding to a second phase difference between the delay clock DLL_CK0 and a clock output from the second fine delay line 142.

The second duty correction circuits (DCC2) 143 control the clock, output from the second fine delay line 142, according to the second duty error. The second duty error may be output from the second duty cycle detector (DCD2) 164. In an embodiment, the second phase-delayed clock DLL_CK90, output from the second duty correction circuit 143, is transmitted to the clock tree 150 (see FIG. 1).

Figure 3:
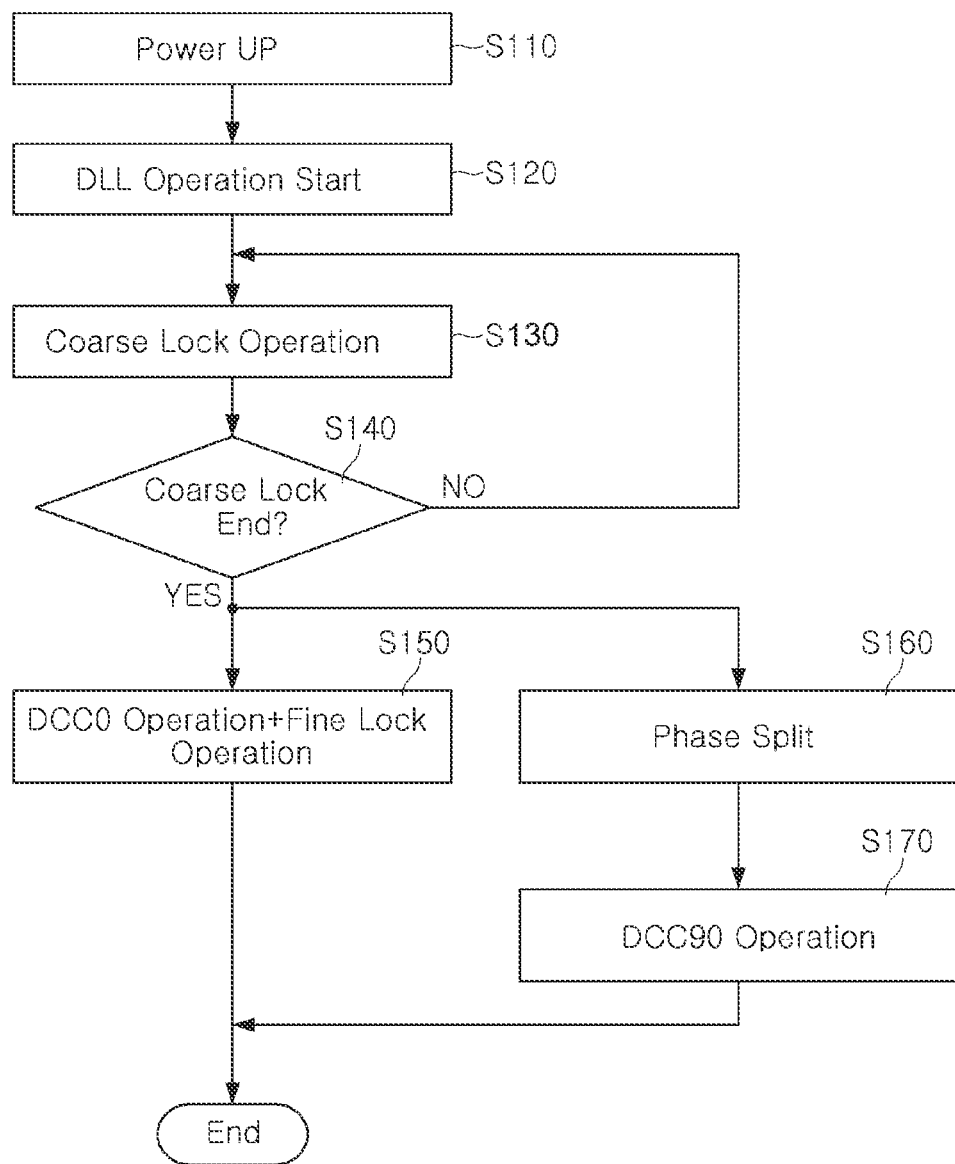
FIG. 3 is a flowchart illustrating an operating method of a multi-phase clock generator according to an exemplary embodiment of the inventive concept.

FIG. 3 is a flowchart illustrating an operating method of a multi-phase clock generator 100 according to an exemplary embodiment of the inventive concept. Referring to FIGS. 1 to 3, the operation of the multi-phase clock generator 100 will be described below.

For ease of description, it will be assumed that the multi-channel generator 100 is mounted in a memory device. During power-up of the memory device, the multi-phase clock generator 100 starts to operate (S110).

The multi-phase clock generator 100 receives an external clock CK, and starts a delay locked loop (DLL) operation using the external clock (S120). The DLL operation may be performed by the first variable delay line (VDL1) 120 delaying the reference clock DLLIN_CK, the variable delay line controller (VDL CNTL) 124 determining a delay amount of the first variable delay line 120 according to the first phase difference, the phase detector (PD) 127 detecting a first phase difference between a reference clock DLLIN_CK and a feedback clock FBCLK, and the replica 128 delaying the first phase-delayed clock DLL_CK0D by a predetermined value to output the feedback clock FBCLK. The DLL operation may include a coarse locking operation and a fine locking operation.

The coarse locking operation is performed according to the first phase difference (S130). Then, a determination is made as to whether the coarse operation locking is finished (S140). When the coarse locking operation is not finished, the flow proceeds to S130.

When the coarse locking operation is finished, a first duty error correction operation (e.g., DCC0) and a fine locking operation is performed on the delay path of the reference clock DLLIN_CK (S150). A phase-split is then performed by respective phase splitter (S160). The phase-split may be formed at the same time as the first duty error correction operation or the fine locking operation. For example, the reference clock DLLIN_CK, a delayed clock DLL_CK0 of the reference clock DLLIN_CK, or first and second phase-delayed clocks DLL_CK0D and DLL_CK90 of the delayed clock DLL_CK0 may be phase-split by phase splitters thereof, respectively. A second duty error correction operation (e.g., DCC90) between the phase-split divided clocks (for example, PDLL90 and PDLL270) having phases is performed (S170).

In an exemplary embodiment, the phase splitting may further include outputting the delayed clock DLL_CK0 to the first phase-delayed clock DLL_CK0D through the fixed delay line (FDL) 130 (see FIG. 1), generating the second phase-delayed clock DLL_CK90 from the delayed clock DLL_CK0 through the variable delay line (VDL2) 140 (see FIG. 1), phase-splitting the first phase-delayed clock DLL_CK0D to generate the first divided clock PDLL0 and the third divided clock PDLL180, and phase-splitting the second phase-delayed clock DLL_CK90 to generate the second divided clock PDLL90 and the fourth divided clock PDLL270. In an exemplary embodiment, the first phase-delayed clock DLL_CK0D has the same phase as the delay clock DLL_CK0, and the second phase-delayed clock DLL_CK90 is obtained by phase-shifting the delay clock DLL_CK0 by 90 degrees.

In an exemplary embodiment, a step of receiving the first phase-delayed clock DLL_CK0D and the second phase-delayed clock DLL_CK90 from the clock tree 150 (see FIG. 1) and outputting the clock DLL_CK0D and the second phase-delayed clock DLL_CK90 by the clock tree 150 is further included in the method of FIG. 3.

Figure 4:
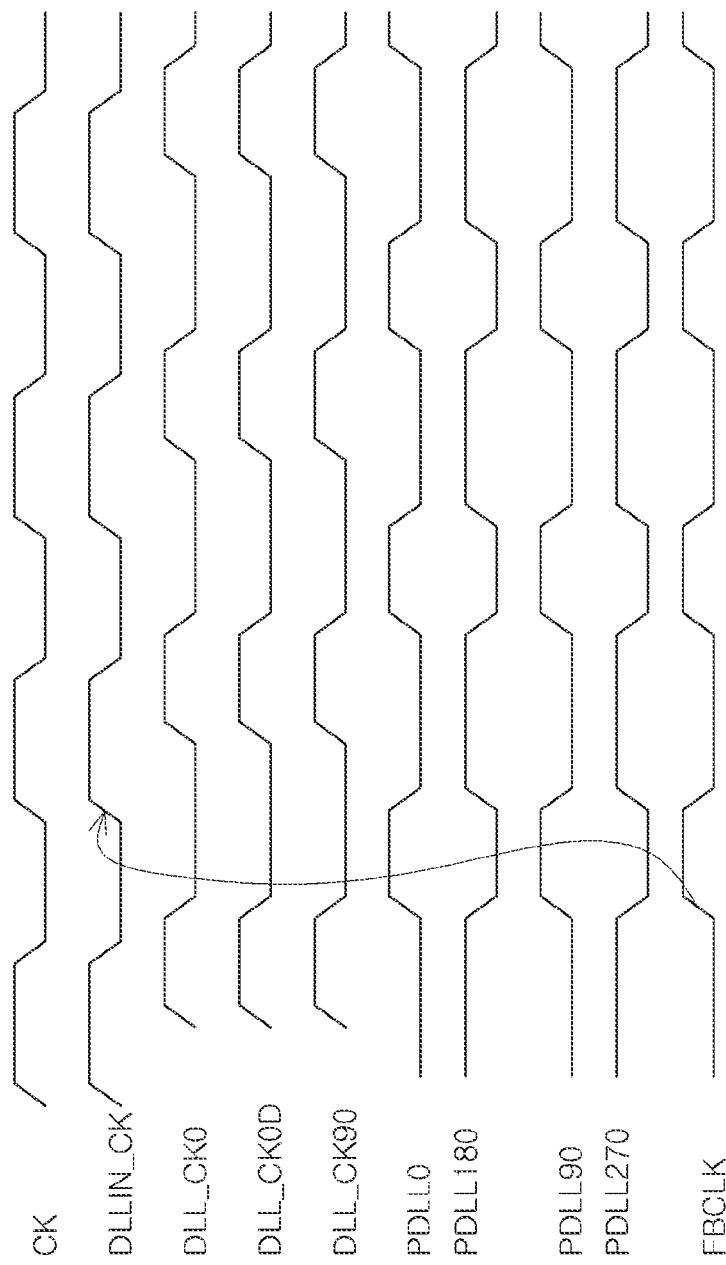
FIG. 4 is a timing diagram illustrating start of a DLL operation illustrated in FIG. 3.

FIG. 4 is a timing diagram illustrating start of the DLL operation illustrated in FIG. 3.

Initial timing when the DLL operation is started will be described with reference to FIG. 4. The reference clock DLLIN_CK and the feedback clock FBCLK are in an unlocked state, as illustrated in FIG. 4. The DLL operation may be started to lock the feedback clock FBCLK to the reference clock DLLIN_CK.

In an exemplary embodiment, the delayed clock DLL_CK0, the first phase-delayed clock DLL_CK0D, and the second phase-delayed clock DLL_CK90 are the same in the initial state. For example, an initial transition from a logic low to a logic high of the delayed clock DLL_CK0, the first phase-delayed clock DLL_CK0D, and the second phase-delayed clock DLL_CK90 may occur at substantially the same time.

In an exemplary embodiment, the first divided clock PDLL0 and the third divided clock PDLL180 are phase-split by a phase splitter to have phases opposite to each other. Similarly, the second divided clock PDLL90 and the fourth divided clock PDLL270 are phase-split by a phase splitter to have phases opposite to each other.

Figure 5:
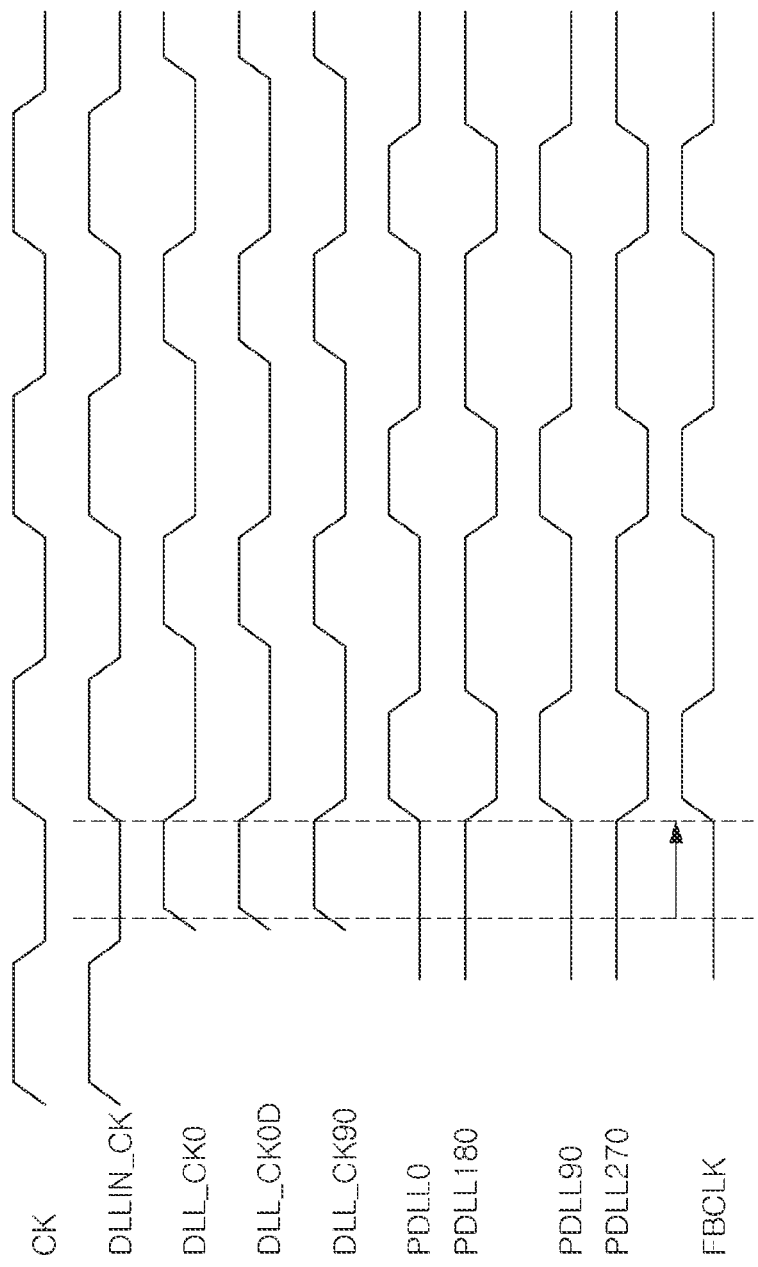
FIG. 5 is a timing diagram of a coarse locking operation illustrated in FIG. 3.

FIG. 5 is a timing diagram of the coarse locking operation illustrated in FIG. 3. Referring to FIG. 5, after a predetermined time, the divided clocks PDLL0, PDLL90, PDLL180, and PDLL270 are output while having different phases at the same point in time by the coarse locking operation.

Figure 6:
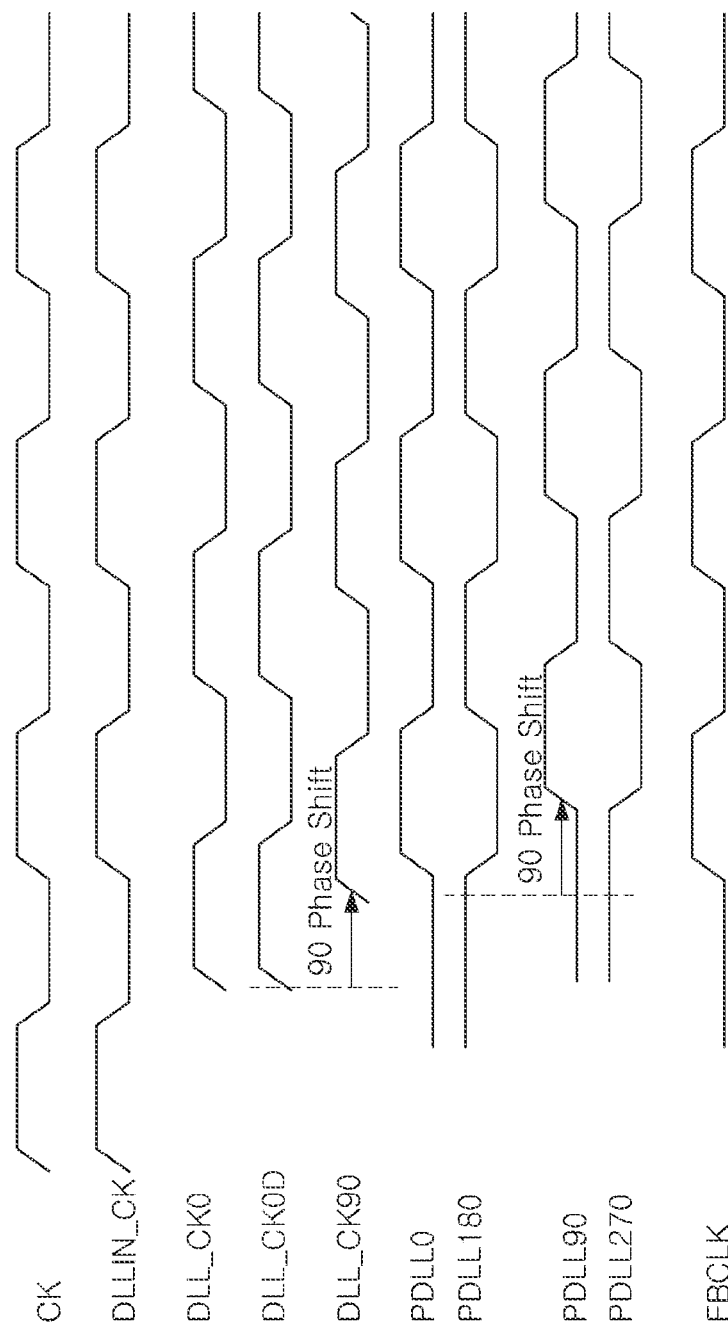
FIG. 6 is a timing diagram of a phase shift operation while performing a duty error correction operation according to an exemplary embodiment of the inventive concept.

FIG. 6 is a timing diagram of a phase shift operation while performing a duty error correction operation according to an exemplary embodiment of the inventive concept. Referring to FIG. 6, a duty error is detected between zero degrees and 180 degrees, and a duty error correction operation may be performed according to the detected duty error. A 90-degree phase shift operation may be performed simultaneously with the duty error correction operation.

As illustrated in FIG. 6, the second phase-delayed clock DLL_CK90 may be generated by performing a 90 degree phase shift operation on the first phase-delayed clock DLL_CKD0. In addition, the first divided clock PDLL0 may be phase-shifted by 90 degrees to generate a second divided clock PDLL90.

In FIGS. 1 to 6, the replica 128 (e.g., a circuit) feeds back the delayed clock DLL_CK0D, output from the fixed delay lines (FDL) 130, to perform the DLL operation. However, embodiments of the present disclosure are not limited thereto. A replica according to an embodiment feeds back an output clock of the first variable delay line VDL1 to perform the DLL operation.

Figure 7:
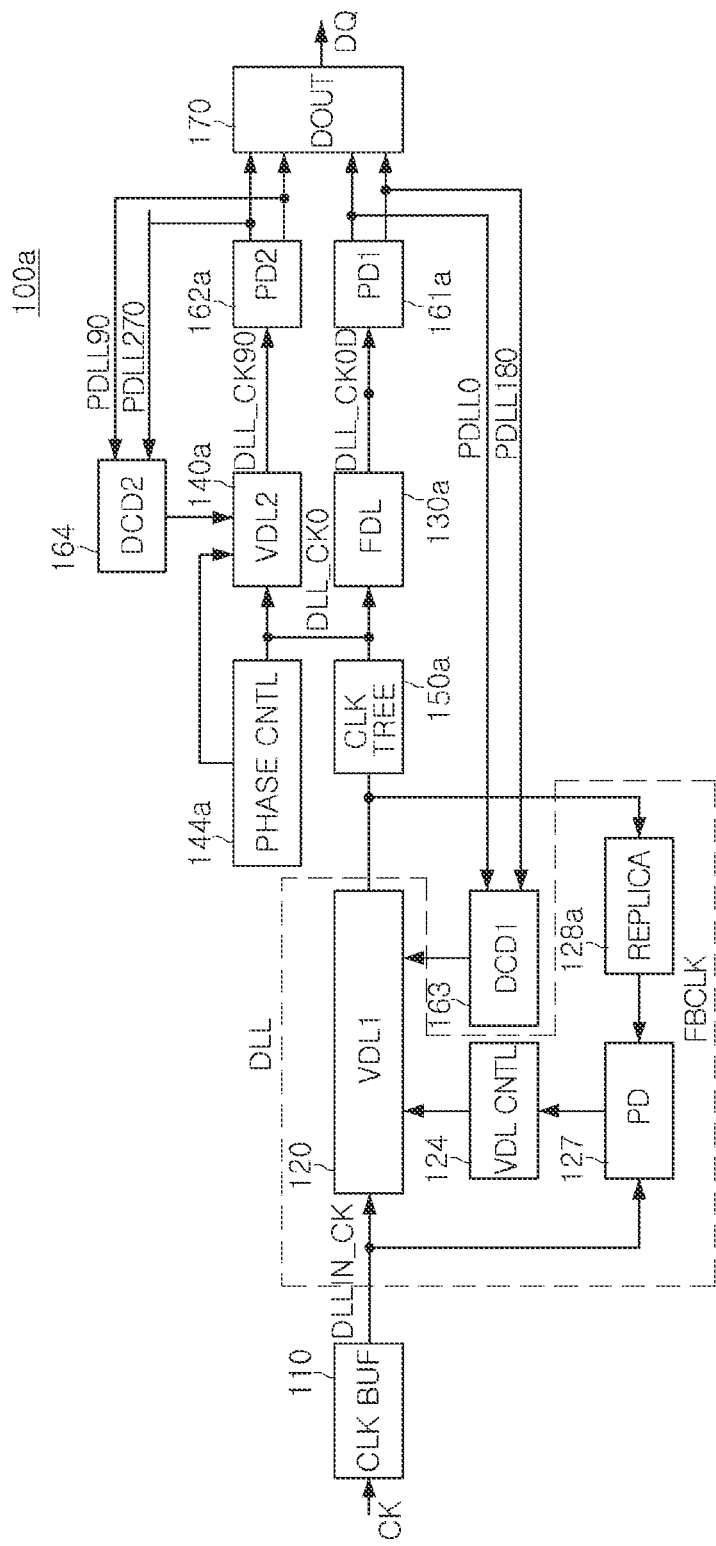
FIG. 7 is a block diagram of a multi-phase clock generator according to an exemplary embodiment of the inventive concept.

FIG. 7 is a block diagram of a multi-phase clock generator 100a according to an exemplary embodiment of the inventive concept. Referring to FIG. 7, the multi-phase clock generator 100a includes a clock buffer 110, a first variable delay line 120, a delay line controller 124, a phase detector 127, a replica 128a (e.g., a circuit), a fixed delay line 130a, second variable delay line 140a, a phase controller 144a, a clock tree 150a, a first phase splitter 161a, second phase splitter 162a, a first duty cycle detector 163, a second duty cycle detector 164, and an output buffer 170.

As illustrated in FIG. 7, the multi-phase clock generator 100a includes the replica 128a receiving feedback from the first variable delay line 120, the clock tree 150a connected to the first variable delay line 100, the fixed delay line 130a delaying a delayed clock DLL_CK0 of the clock tree 150a, the second variable delay line 140a controlling a phase of the delayed clock DLL_CK0 of the clock tree 150a, and a phase detector 144a controlling the second variable delay line 140a, as compared with the multi-phase clock generator 100 illustrated in FIG. 1.

Figure 8:
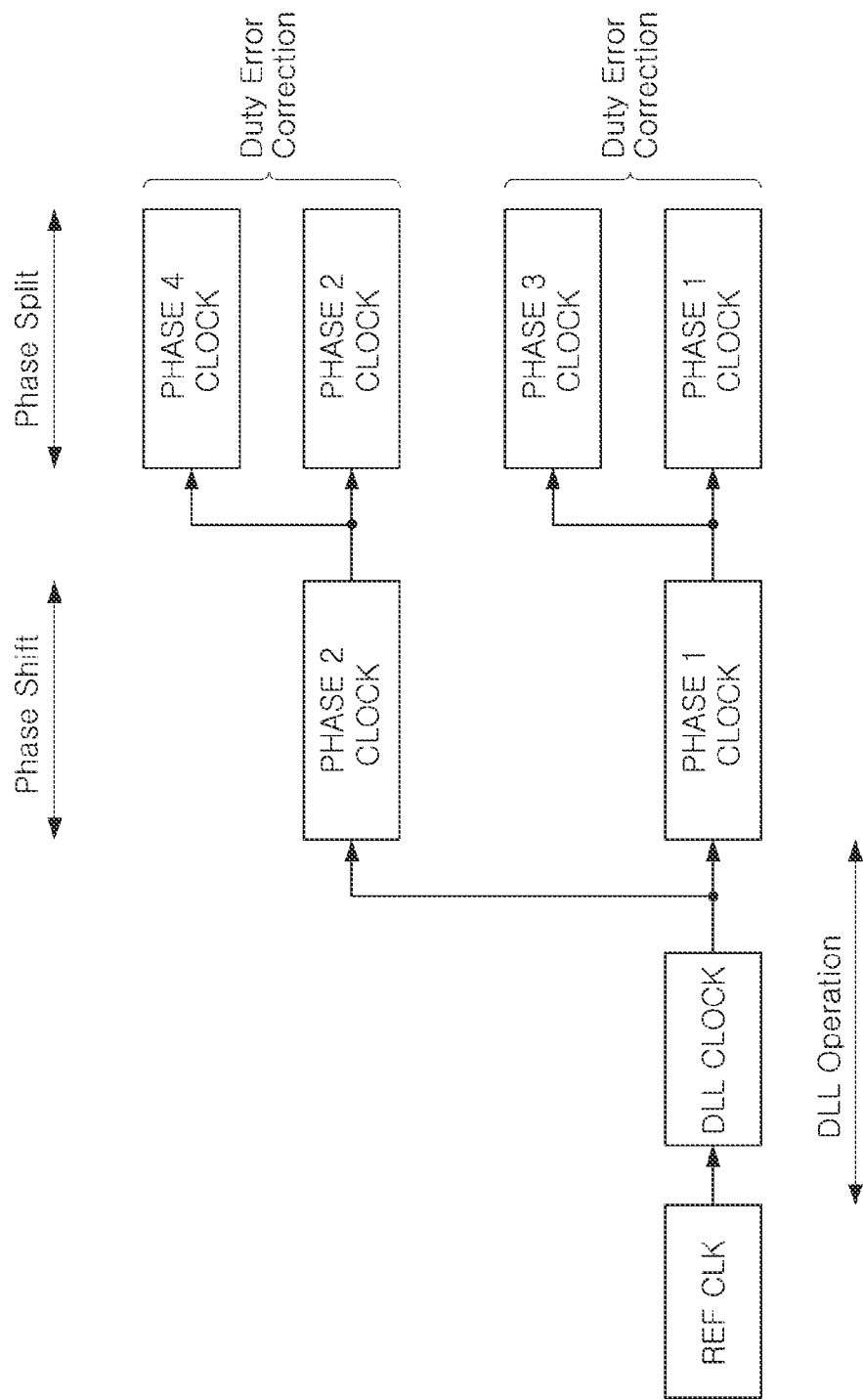
FIG. 8 is a schematic block diagram illustrating a process in which multi-phase clocks are generated by a multi-phase clock generator according to an exemplary embodiment of the inventive concept.

FIG. 8 is a schematic block diagram illustrating a process in which multi-phase clocks are generated by a multi-phase clock generator according to an exemplary embodiment of the inventive concept. Referring to FIG. 8, a reference clock REF CLK is divided into four phase clocks having different phases through a phase shift and a phase split while performing a DLL operation. An externally received single phase clock may be divided into four phase clocks through a DLL operation, a phase shift operation, or a phase split operation.

In an exemplary embodiment, in a phase shift period, the first phase clock DLL_CK0D (see FIG. 1) and the second phase clock DLL_CK90 are divided from the DLL clock DLL_CK0 (see FIG. 1). The DLL clock may be a clock output by performing a DLL operation on a clock path of a reference clock REF CLK.

In an exemplary embodiment, in a phase split period, the first phase clock PDLL0 (see FIG. 1,) and the third phase clock PDLL180 (see FIG. 1) are phase-split from the first phase clock DLL_CK0D, and the second phase clock PDLL90 (see FIG. 1) and the fourth phase clock PDLL270 (see FIG. 1) are phase-split from the second phase clock DLL_CK90.

In an exemplary embodiment, a duty error correction corresponding to a duty error is performed between the first phase clock PDLL0 and the third phase clock PDLL180. In an exemplary embodiment, a duty error correction corresponding to a duty error is performed between the second phase clock PDLL90 and the fourth phase clock PDLL270.

The multi-phase clock generator according to an exemplary embodiment may be applied to a memory device.

Figure 9:
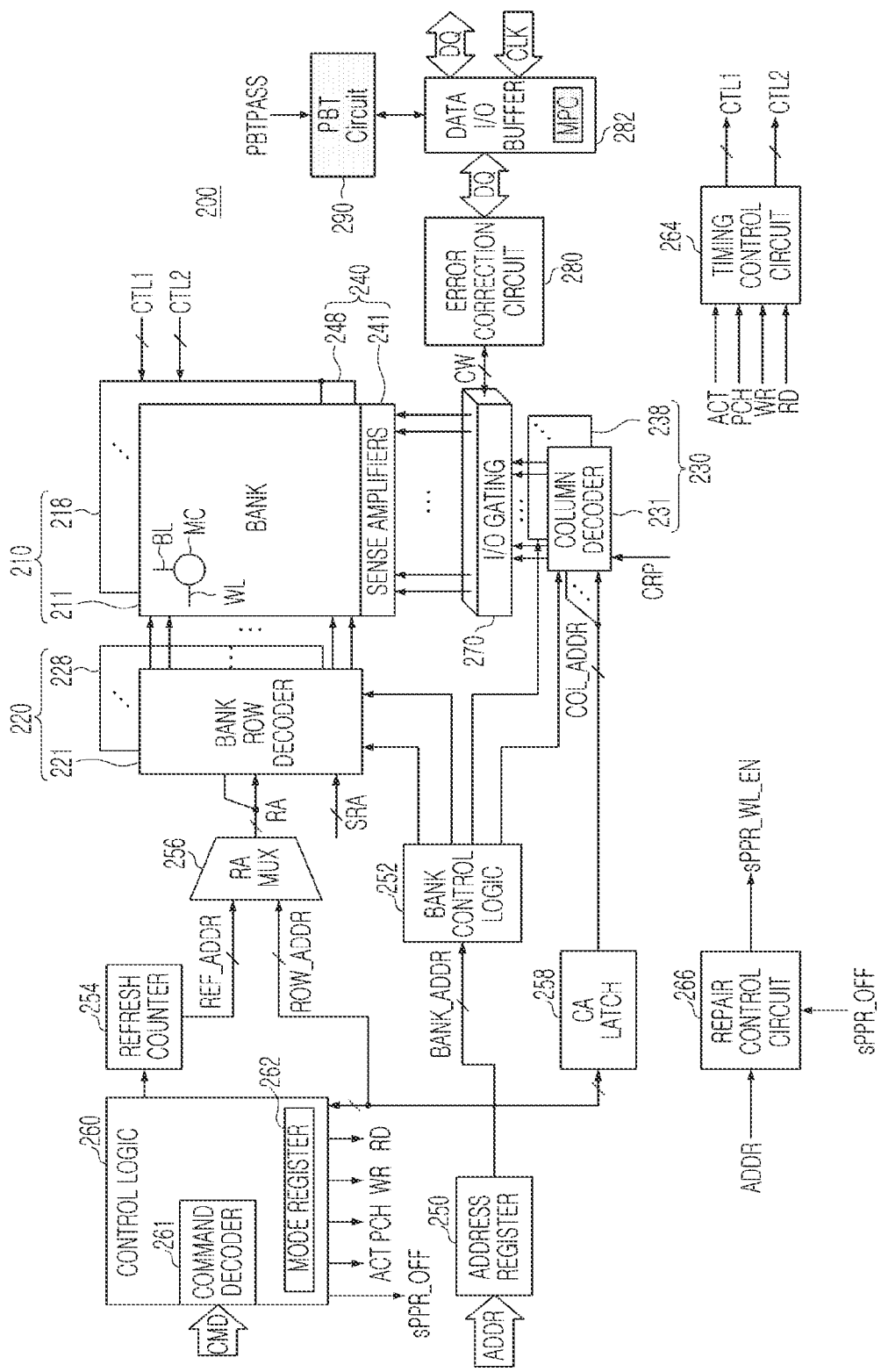
FIG. 9 is a block diagram of a memory device according to an exemplary embodiment of the inventive concept.

FIG. 9 is a block diagram of a memory device 200 according to an exemplary embodiment of the inventive concept. Referring to FIG. 9, the memory device 200 includes a memory cell array 210, a row decoder 220, a column decoder 230, a sense amplifier circuit 240, an address register 250, a bank control logic 252, a refresh counter 254, row address multiplexer 256, a column address latch 258, a control logic 260, a repair control circuit 266, a timing control circuit 264, an input/output (I/O) gating circuitry 270, an error correction circuit 280, a data input/output (I/O) buffer 282, and a PBT circuit 290.

The memory cell array 210 may include first to eighth banks 211 to 218. However, the number of banks of the memory cell array 210 is not limited thereto.

The row decoder 220 may include first to eighth bank row decoders 221 to 228, respectively connected to the first to eighth banks 211 to 218.

The column decoder 230 may include first to eighth bank column decoders 231 to 238, respectively connected to the first to eighth banks 211 to 218.

The sense amplifier circuit 240 may include first to eighth bank sense amplifiers 241 to 248, respectively connected to the first to eighth banks 211 to 218.

The first to eighth banks 211 to 218, the first to eighth bank row decoders 221 to 228, the first to eighth bank column decoders 231 to 238, the first to eighth bank sense amplifiers 241 to 248 may constitute the first to eighth banks, respectively. Each of the first to eighth banks 211 to 218 may include a plurality of memory cells MC formed at intersections of word lines WL and bit lines BL.

The address register 250 may receive and store an address ADDR having a bank address BANK_ADDR, a row address ROW_ADDR, and a column address COL_ADDR from an external memory controller. The address register 250 may provide the received bank address BANK_ADDR to the bank control logic 252, may provide the received row address ROW_ADDR to the row address multiplexer 256, and may provide the received column address COL_ADDR to the column address latch 258.

The bank control logic 152 may generate bank control signals in response to the bank address BANK_ADDR. Among the first to eighth bank row decoders 221 to 228, a bank row decoder corresponding to the bank address BANK_ADDR may be activated in response to bank control signals. Among the first to eighth bank column decoders 231 to 238, a bank column decoder corresponding to the bank address BANK_ADDR may be activated in response to the bank control signals.

The row address multiplexer 256 may receive a row address ROW_ADDR from the address register 250 and may receive a refresh row address REF_ADDR from the refresh counter 254. The row address multiplexer 256 may selectively output the row address ROW_ADDR or the refresh row address REF_ADDR as a row address RA. The row addresses RA, output from the row address multiplexer 256, may be applied to each of the first to eighth bank row decoders 221 to 228.

Among the first to eighth bank row decoders 221 to 228, a bank row decoder activated by the bank control logic 252 may decode the row address RA, output from the row address multiplexer 256, to activate a word line corresponding to a row address. For example, the activated bank row decoder may apply a word line driving voltage to a word line corresponding to the row address. In addition, the activated bank row decoder may activate the word line corresponding to the row address and may simultaneously activate a redundancy word line corresponding to a redundancy row address output from the repair control circuit 266.

The column address latch 258 may receive a column address COL_ADDR from the address register 250 and may temporarily store the received column address COL_ADDR. In addition, the column address latch 158 may incrementally increase the received column address COL_ADDR in a burst mode. The column address latch 258 may apply the temporarily stored or incrementally increased column address COL_ADDR to each of the first to eighth bank column decoders 231 to 238.

Among the first to eighth bank column decoders 231 to 238, a bank column decoder activated by the bank control logic 252 may activate a sense amplifier, corresponding to the bank address BANK_ADDR and the column address COL_ADDR, through the input/output gating circuitry 270. In addition, the activated bank column decoder may perform a column repair operation in response to a column repair signal CRP output from the repair control circuit 266.

The control logic 260 may control the operation of the memory device 200. For example, the control logic 260 may generate control signals such that the semiconductor memory device 200 performs a writing operation or a reading operation. The control logic 260 may include a command decoder 261, decoding a command CMD received from the memory controller, and a mode register set 262 setting an operating mode of the memory device 200.

For example, the command decoder 261 may decode a write enable signal/WE, a row address strobe signal/RAS, a column address strobe signal/CAS, and a chip select signal/CS to generate operation control signals ACT, PCH, WE, and RD corresponding to the command CMD. The control logic 260 may provide the operation control signals ACT, PCH, WE, and RD to the timing control circuit 264. The control signals ACT, PCH, WR, and RD may include an active signal ACT, a precharge signal PCH, a write signal WR, and a read signal RD. The timing control circuit 264 may generate first control signals CTL1 for controlling a voltage level of a word line WL, and second control signals CTL2 for controlling a voltage level of a bit line BL, in response to the operation control signals ACT, PCH, WR, and RD, and may provide the first control signals CTL1 and the second control signals CTL2 to the memory cell array 210.

The repair control circuit 266 may generate repair control signals CRP and SRP for controlling repair operations of a first cell region and a second cell region of at least one bank, among the banks, according to the row address ROW_ADDR and the column address COL_ADDR of an address ADDR (or an access address) and fuse information of each of the word lines. The repair control circuit 266 may provide a redundancy row address to a corresponding bank row decoder, may provide a column repair signal CRP to a corresponding bank column decoder, and may provide a selection signal and an enable signal SRA to a block control circuit associated with a corresponding redundancy array block. Also, the repair control circuit 266 may generate an hPPR word line activation signal in response to the address ADDR in an hPPR mode stored in the mode register set 262. Also, the repair control circuit 266 may generate an sPPR word line activation signal sPPR_WL_EN in response to the address ADDR in an sPPR mode stored in the mode register set 1262. Also, the repair control circuit 266 may turn off an sPPR logic in an sPPR_OFF mode and may generate a normal word line activation signal to access previous data. In an exemplary embodiment, the repair control circuit 266 varies a repair unit according to the address ADDR and fuse information. For example, the repair control circuit 266 may vary the type and number of the address ADDR and the fuse address information.

The input/output gating circuitry 270 may include a plurality of input/output gate circuits. Each of the plurality of input/output gate circuits may include circuits for gating input/output data and may further include an input data mask logic, data latches for storing data output from the first to eighth banks 211 to 218, and write drivers for wiring data to the first to eighth banks 211 to 218.

The error correction circuit 280 may generate parity bits according to data bits of data DQ provided from the data input/output buffer 282 in a writing operation and may provide a codeword CW, including the data DQ and the parity bits, to the input/output gating circuitry 270, and the input/output gating circuitry 270 may write a codeword CW to a bank. Also, the error correction circuit 280 may receive the codeword CW, read from a single bank, from the input/output gating circuitry 270 in a reading operation. In an embodiment, the error correction circuit 280 performs ECC decoding on the data DQ using parity bits, included in the read codeword CW, to correct at least one error bit, included in the data DQ, and to provide the at least one corrected error bit to the data input/output buffer 282.

In an exemplary embodiment, a codeword CW to be read in one of the first to eighth banks 211 to 218 is sensed by a sense amplifier corresponding to the one bank and is stored in the read data latches. The codeword CW, stored in the read data latches, may be provided to the memory controller through the data input/output buffer 282 after ECC decoding is performed by the error correction circuit 280. Data DQ to be written to one of the first to eighth banks 211 to 218 may be written to the one bank through write drivers after the ECC encoding is performed by the error correction circuit 280.

The data input/output buffer 282 may provide the data DQ to the error correction circuit 280 according to a clock CLK provided from the memory controller in the writing operation and may provide the data DQ, provided from the error correction circuit 280, to the memory controller in the reading operation.

In an exemplary embodiment, the data input/output buffer 282 includes the multi-phase clock generator (MPC) 100 (see FIG. 1) described in FIGS. 1 to 8. An externally received clock may be divided into multi-phase clocks. A data output operation may be performed using such divided clocks.

The PBT circuit 290 may perform a parallel test operation on externally received test data and each of the banks, may perform a repair operation when an error is correctable, and may output a result value according to the result. Also, the PBT circuit 290 may pass a bank in response to a test pass signal PBTPASS, regardless of a result value of a test operation of a corresponding bank. In an exemplary embodiment, the test pass signal PBTPASS is output from the mode register set 262 in a parallel bit test operation.

A memory device (for example, a DRAM) may divide an external clock and use the divided clocks to overcome an internal frequency limit. For example, the divided clocks may include four phases. A data output terminal of the memory device may restore the divided clocks to the same frequency as the received external clock. However, when the memory device uses a multi-phase clock, skew may be generated between multiple phases. Such skew may cause a duty error when a divided clock is restored to the same frequency as the external clock.

The memory device 200 according to an exemplary embodiment of the inventive concept includes a multi-phase clock generator MPC to accurately match a phase relationship between multiple phases to 90 degrees. The multi-phase clock generator MPC of the present disclosure may correct a duty error of a divided clock by inputting the divided clock to a duty cycle detector DCC to compensate for skew between zero degrees and 180 degrees (or skew between 90 degrees and 270 degrees). In addition, the multi-phase clock generator MPC according to an embodiment of the present disclosure may correct the skew between zero degrees and 90 degrees using a 90-degree phase shift to generate a multi-phase clock. In this case, a phase shift operation may be performed using a ring oscillator.

The memory device according to an exemplary embodiment may be implemented as a stacked memory device.

Figure 10:
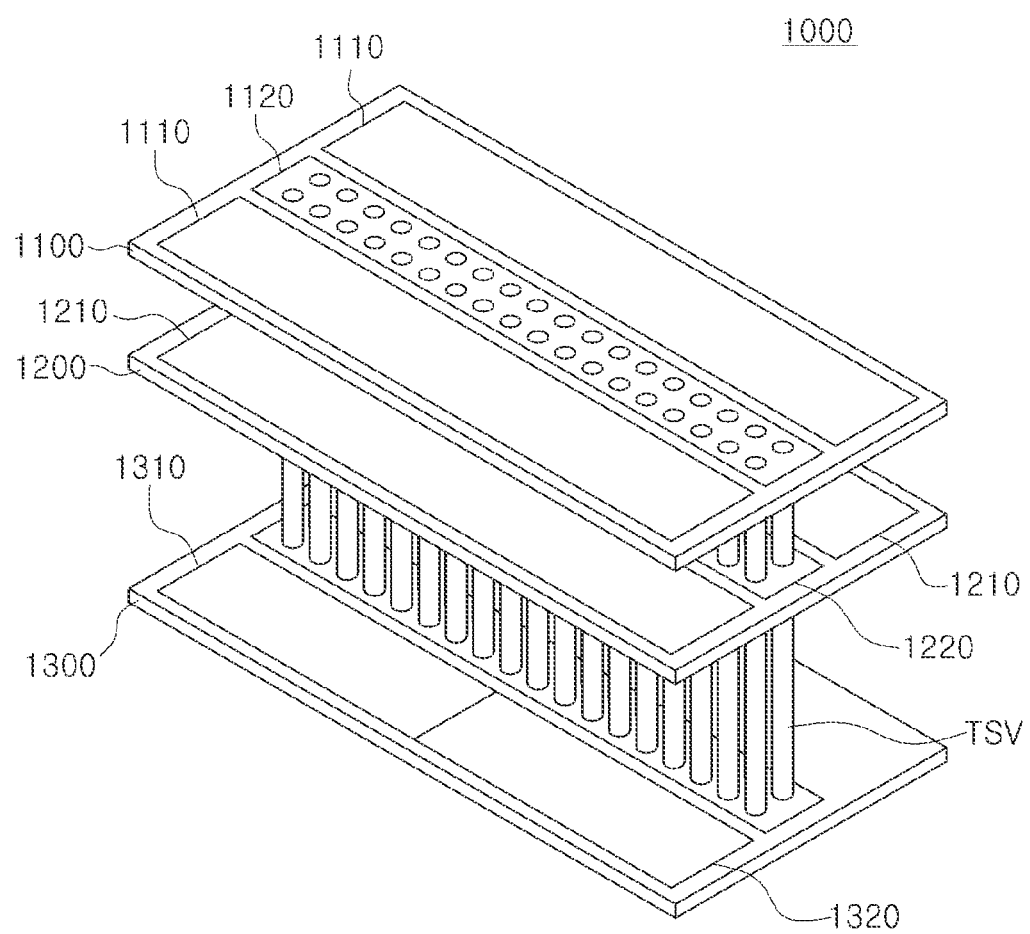
FIG. 10 is a perspective view of a memory chip according to an exemplary embodiment of the inventive concept.

FIG. 10 is a perspective view of a memory chip according to an exemplary embodiment of the inventive concept. Referring to FIG. 10, the memory chip 1000 includes first to third memory dies 1100 to 1300, stacked in a direction perpendicular to a substrate, and through-silicon vias (TSVs). The number of the stacked memory dies is not limited to that illustrated in FIG. 10. For example, the first and second memory dies 1100 and 1200 may be slave dies, and the third memory die 1300 may be a master die or a buffer die.

The first memory die 1100 may include a first memory cell array 1110 and a first through-electrode region 1120 for access to the first memory cell array 1110. The second memory die 1200 may include a second memory cell array 1210 and a second through-electrode region 1220 for access to the second memory cell array 1210. The first through-electrode region 1120 may refer to a region in which the through-electrodes for communication between the first memory die 1100 and the third memory die 1300 are disposed in the first memory die 1100. Similarly, the second through-electrode region 1220 may refer to a region in which the through-electrodes for communication between the second memory die 1200 and the third memory die 1300 are disposed in the second memory die 1200. The through-electrodes may provide electrical paths between the first to third memory dies 1100 to 1300.

The first to third memory dies 1100 to 1300 may be electrically connected to each other by through-electrodes. For example, the number of the through-electrodes may be hundreds to thousands, and the through-electrodes may be disposed in a matrix form. The third memory die 1300 includes a first peripheral circuit 1310 and a second peripheral circuit 1320. The first peripheral circuit 1310 may include circuits for accessing the first memory die 1100, and the second peripheral circuit 1320 may include circuits for accessing the second memory die 1200. In an exemplary embodiment, each of the peripheral circuits 1310 and 1320 may be implemented by the method of generating a multi-phase clock and the memory device described in FIGS. 1 to 9.

The memory device according to an exemplary embodiment may be applied to a computing system.

Figure 11:
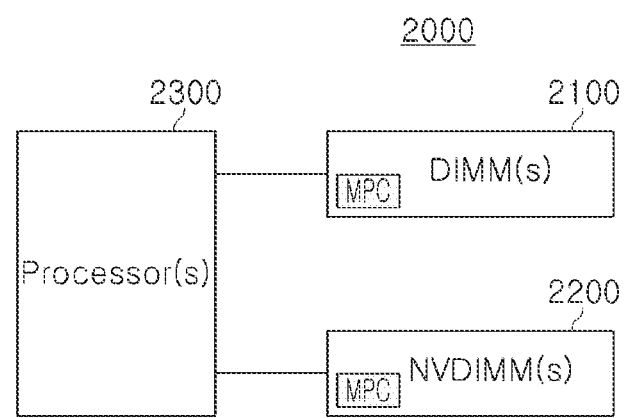
FIG. 11 is a block diagram of a computing system according to an exemplary embodiment of the inventive concept.

FIG. 11 is a block diagram of a computing system 200 according to an exemplary embodiment of the inventive concept. Referring to FIG. 11, the computing system 2000 includes at least one volatile memory module (DIMM(s)) 2100, at least one nonvolatile memory module (NVDIMM(s)) 2200, and at least one central processing unit (CPU(s)) 2300.

The computing system 2000 may be used as one of a plurality of devices such as a computer, a portable computer, an ultra-mobile personal computer (UMPC), a workstation, a data server, a net-book, a personal data assistant (PDA), a web tablet, a wireless phone, a mobile phone, a smartphone, an e-book, a portable multimedia player (PMP), a digital camera, a digital audio recorder/player, a digital picture/video recorder/player, a portable game machine, a navigation system, a black box, a 3D television, a device capable of transmitting and receiving information wirelessly, a wearable device, one of various electronics devices constituting a home network, one of various electronics devices constituting a computer network, one of various electronics devices constituting a telematics network, a radio-frequency identification (RFID) device, or one of various electronic devices constituting a computing system.

The at least one nonvolatile memory module 2200 may include at least one nonvolatile memory. In an exemplary embodiment, the at least one nonvolatile memory may include a NAND flash memory, a vertical NAND flash memory (VNAND), a NOR flash memory, a resistive random access memory (RRAM), a phase-change memory (PRAM), a magneto-resistive random access memory (MRAM), a ferroelectric random access memory (FRAM), a spin transfer toque random access memory (STT-RAM), or a thyristor random access memory (TRAM).

In an exemplary embodiment of the inventive concept, at least one of the memory modules 2100 and 2200 is implemented to perform the multi-phase clock generation operation described in FIGS. 1 to 9.

In an embodiment, the memory modules 2100 and 2200 may be connected to the processor 2300 according to a DDRx interface (where x is an integer of 1 or more).

The at least one central processing unit 2300 may be implemented to control the volatile memory module 2100 and the nonvolatile memory module 3200. In an exemplary embodiment, the central processing unit 2300 may include a general purpose microprocessor, a multicore processor, a digital signal processor (DSP), an application specific integrated circuit (ASIC), or a combination thereof.

The memory device according to an exemplary embodiment may be applied to an automotive system.

Figure 12:
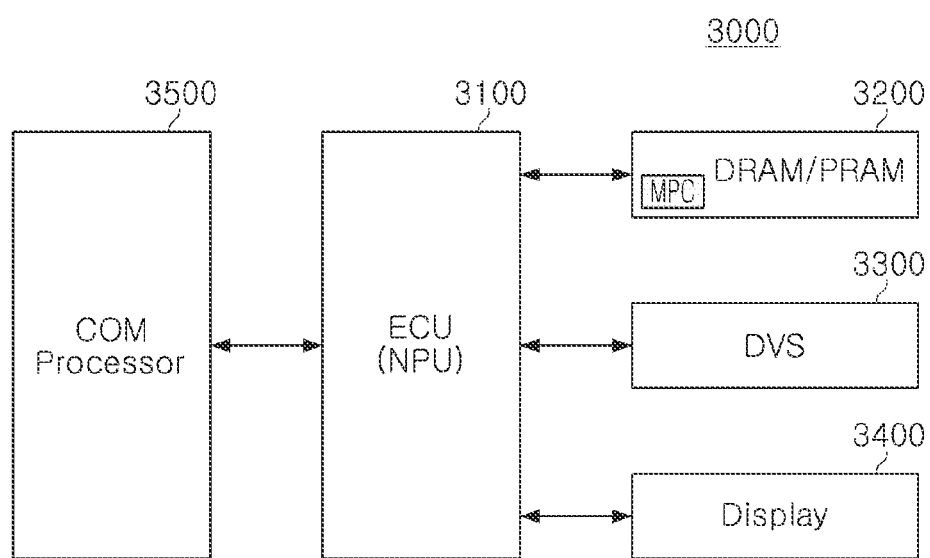
FIG. 12 is a block diagram of a vehicular electronic system according to an exemplary embodiment of the inventive concept.

FIG. 12 is a block diagram of a vehicular electronic system 3000 according to an exemplary embodiment of the inventive concept. Referring to FIG. 12, the vehicular electronic system 3000 includes at least one electronic control unit (ECU(s)) 3100, a memory device 3200, a dynamic range sensor (DVS) 3300, a display device 3400, and a communications processor 3500.

The electronic control unit (ECU) 3100 may be implemented to control overall operations. The ECU 3100 may process image data received from the DVS 3300. The ECU 3100 may include a neural processing unit (NPU). The NPU may compare an image, received from the DVS 3300, with a learning model to rapidly derive an optimal image for driving.

The memory device 3200 may be implemented to store a learning model associated with the operation of the NPU. The memory device 3200 may include a volatile or nonvolatile memory device. For example, the memory device 3200 may include a DRAM or a PRAM. In particular, the memory device 3200 may perform a multi-phase clock generation operation as described with reference to FIGS. 1 to 9.

The dynamic range sensor (DVS) 3300 may be implemented to sense an environment outside of a vehicle. The DVS 3300 may output an event signal in response to a change in relative intensity of light. The DVS 3300 may include a pixel array, including a plurality of DVS pixels, and address event processors.

The display device 3400 may be implemented to display an image processed by the ECU 3100 or an image transmitted by the communication processor 3500.

The communications processor 3500 may be implemented to transmit the processed image to an external device, for example, an external vehicle, or to receive an image from the external vehicle. For example, the communications processor 3500 may be implemented to perform wired or wireless communication with the external device.

Further, at least one embodiment of the present disclosure may be applied to a mobile device.

Figure 13:
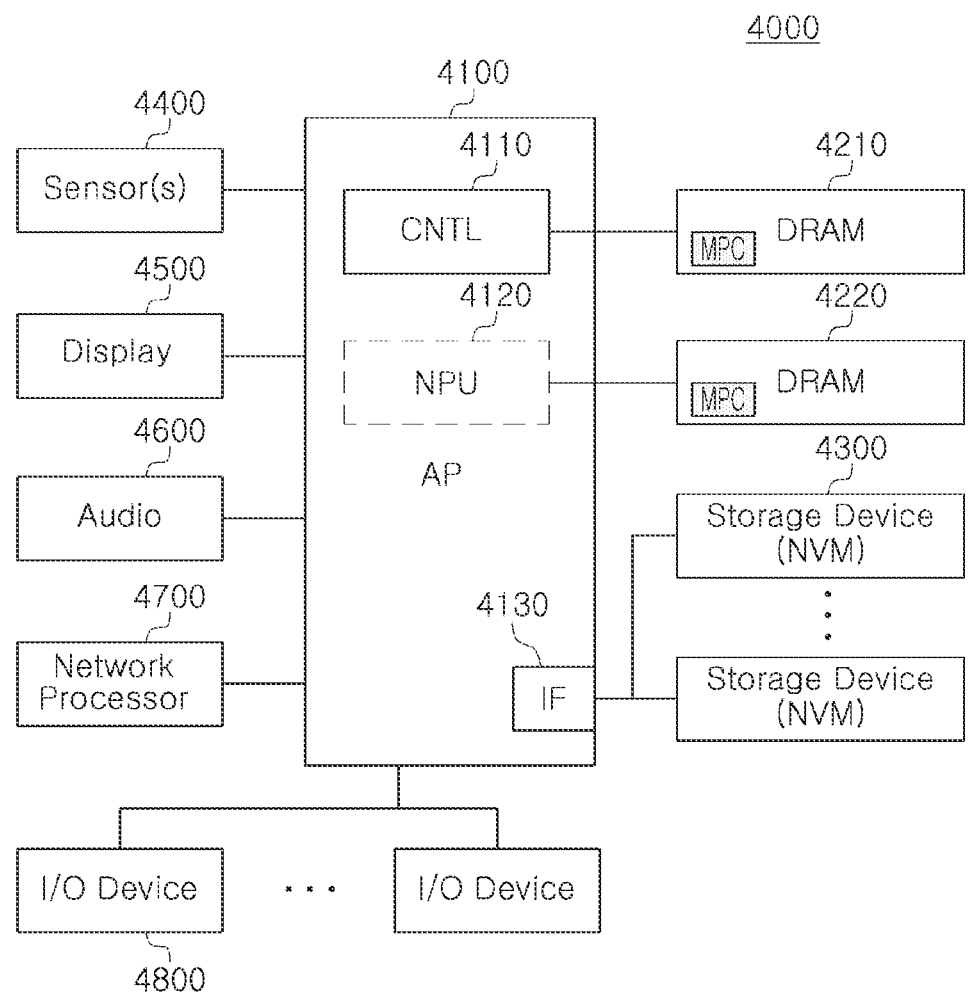
FIG. 13 is a block diagram of a mobile device according to an exemplary embodiment of the inventive concept.

FIG. 13 is a block diagram of a mobile device 4000 according to an exemplary embodiment of the inventive concept. Referring to FIG. 13, the mobile device 4000 includes an application processor 4100, at least one DRAM (e.g., 4210, 4220, etc.), at least one storage device 4300, at least one sensor 4400, a display device 4500, an audio device 4600, a network processor 4700, and at least one input/output device 4800. For example, the mobile device 4000 may be implemented as a laptop computer, a mobile phone, a smartphone, a tablet personal computer (PC), or a wearable computer.

The application processor 4100 may be implemented to control overall operation of the mobile device 4000. The application processor 4100 may execute applications providing Internet browsers, games, and videos. In an exemplary embodiment, the application processor 4100 may include a single core or a multi-core. For example, the application processor 4100 may include a multi-core such as a dual-core, a quad-core, or hexa-core. In an exemplary embodiment, the application processor 4100 may further include a cache memory disposed inside or outside thereof.

The application processor 4100 may include a controller 4110, a neural processing unit (NPU) 4120, and an interface 4130. In an exemplary embodiment, the NPU 4120 is optional and may be omitted.

In an exemplary embodiment, the application processor 4100 is implemented as a system-on-chip (SoC). A kernel of an operating system, driven on the system-on-chip (SoC), may include an input/output (I/O) scheduler and a device driver for controlling the storage device 4300. The device driver may control access performance of the storage device 4300 with reference to the number of synchronous queues managed by the input/output scheduler, or may control a CPU mode inside the SoC or a dynamic voltage frequency scaling (DVFS) level.

The DRAM 4210 may be connected to the controller 4110. The DRAM 4210 may store data required for the operation of the application processor 4100. For example, the DRAM 4210 may temporarily store an operating system (OS) and application data, or may be used as an execution space of various software codes. The DRAM 4220 may be connected to the NPU 4120. The DRAM 4220 may store data associated with an artificial intelligence (AI) operation.

The DRAM 4210 has relatively higher latency and bandwidth (BW) than an I/O device or a flash memory. The DRAM 4210 may be initialized at a power-on time of the mobile device 4000. When an operating system and application data are loaded, the DRAM 4210 may be used as locations, in which the operating system and application data are temporarily stored, or as spaces in which various software codes are executed. A mobile system may perform a multitasking operation to simultaneously load multiple applications, and the switching and execution speed between the applications may be used as a performance index or measure of the mobile system.

The DRAMs 4210 and 4220 may include a multi-phase clock generator receiving a single-phase clock to generate multi-phase clocks, as described in FIGS. 1 to 9.

The storage device 4300 may be connected to the interface 4130. In an exemplary embodiment, the interface 4130 may operate using at least one communication protocol among double data rate (DDR), DDR2, DDR3, DDR4, low power DDR (LPDDR), universal serial bus (USB), multimedia card (MMC), embedded MMC, peripheral component interconnection (PCI), non-volatile memory express (NVMe), PCI-express (PCIe), serial at attachment (SATA), small computer small interface (SCSI), serial attached SCSI (SAS), USB attached SCSI (UAS), internet SCSI (iSCSI), fiber channel, and fiber channel over Ethernet (FCoE). In an exemplary embodiment, any one storage device 4300 is included in the mobile device 4000 in an embedded form. In an exemplary embodiment, any one storage device 4300 is included in the mobile device 4000 in a removable manner.

The storage device 4300 may be implemented to store user data. For example, the storage device 4300 may store data collected from the sensor 4400 or network data, augmented reality (AR)/virtual reality (VR) data, and high-definition (HD) 4K contents. The storage device 4300 may include at least one nonvolatile memory device. For example, the storage device 4300 may include a solid-state driver (SSD) or an embedded multimedia card (eMMC).

In an exemplary embodiment, the storage device 4300 may be implemented as an additional chip in the application processor 4100, or may be implemented as a single package with the application processor 4100. In an exemplary embodiment, the storage device 4300 may be mounted using various types of packages. For example, the storage device 4300 may be mounted using packages such as a package-on-package (PoP), ball grid arrays (BGAs), chip-scale packages (CSPs), a plastic-leaded chip carrier (PLCC), a plastic dual in-line package (PDIP), a die-in waffle pack, a die-in wafer form, a chip-on board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system-in package (SIP), a multi-chip package (MCP), a wafer-level fabricated package (WFP), or a wafer-level processed stack package (WSP).

The sensor 4300 may be implemented to sense an external environment of the mobile device 4000. In an exemplary embodiment, the sensor 4300 includes an image sensor sensing an image. In this case, the sensor 4300 may transmit generated image information to the application processor 4100. In an exemplary embodiment, the sensor 4300 includes a biosensor detecting biometric information. For example, the sensor 4300 may detect a fingerprint, an iris pattern, a blood vessel pattern, a heart rate, or blood glucose, and may generate sensing data corresponding to the sensed information. However, the sensor 4300 is not limited to the image sensor and the biosensor. For example, the sensor 4300 according to an exemplary embodiment of the present disclosure may include an arbitrary sensor such as an illuminance sensor, an acoustic sensor, or an acceleration sensor.

The display device 4500 may be implemented to output data. For example, the display device 4500 may output image data sensed using the sensor 4300 or may output data calculated using the application processor 4100. The audio device 4600 may be implemented to output voice data to an external entity or to sense an external voice. The network processor 4700 may be implemented to communicate with an external device through a wired or wireless communication method. The input/output device 4800 may be implemented to input data to the mobile device 4000 or to output data from the mobile device 4000. The input/output device 4800 may include devices, providing digital input and output functions, such as universal serial bus (USB), a storage, digital camera, an SD card, a touch screen, a DVD, a modem, or a network adapter.

At least one embodiment of the present disclosure may be applied to various types of computing systems (for example, CPU/GPU/NPU platforms).

Figure 14:
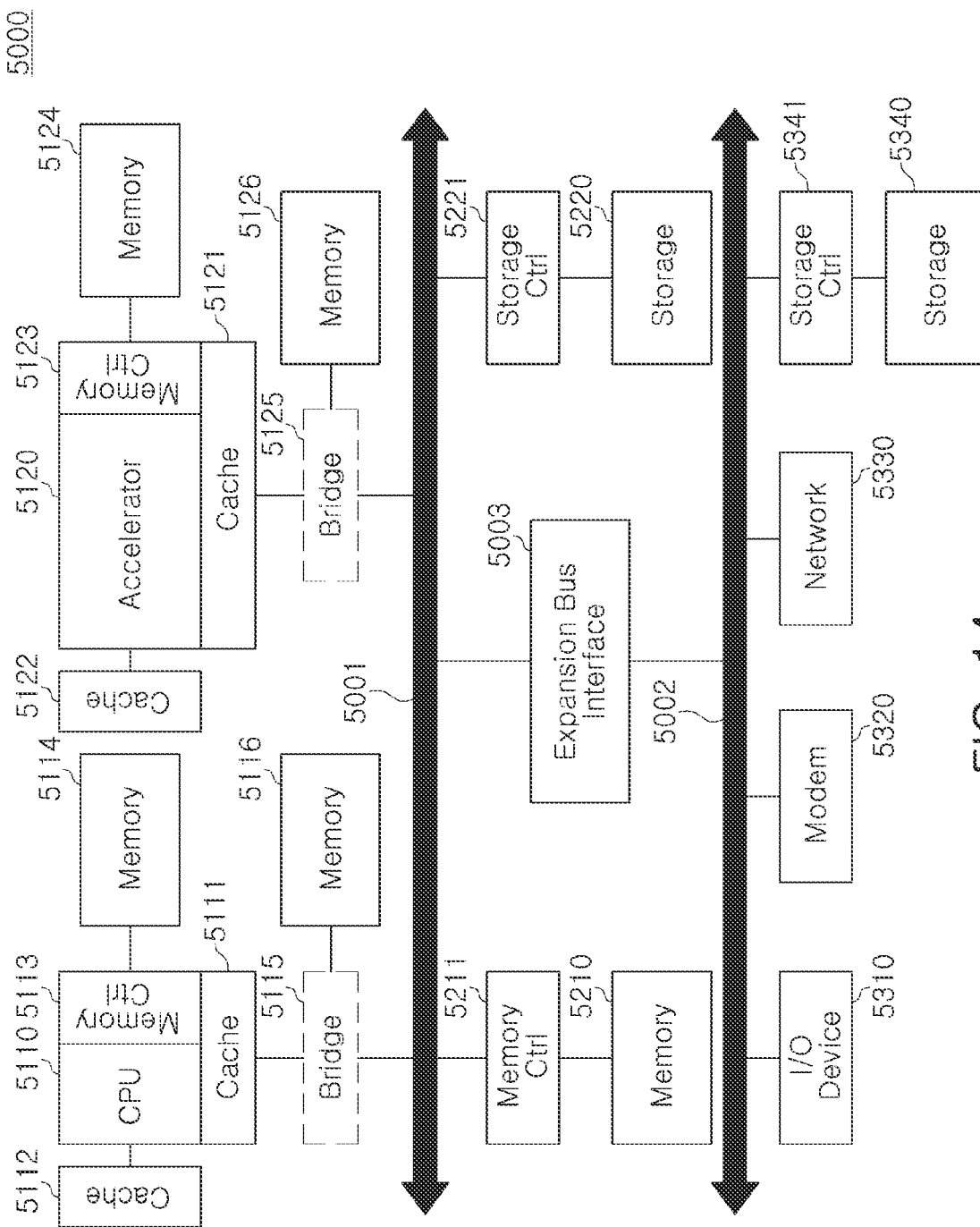
FIG. 14 is a block diagram of a computing system according to an exemplary embodiment of the inventive concept.

FIG. 14 is a block diagram of a computing system 500 according to an exemplary embodiment of the inventive concept. Referring to FIG. 14, the computing system 5000 includes a central processing unit (CPU) 5110, a graphics processing unit (GPU) 5120 (e.g., an accelerator), a neural processing unit (NPU), an application-specific processing unit connected to the system bus 5001, a memory device 5210 or a storage device 5220 connected to the system bus 5001, and an input/output device 5310, a modem 5320, a network device 5330, or a storage device 5340 connected to an expansion bus 5002. The expansion bus 5002 may be connected to the system bus 5001 through an expansion bus interface 5003.

In an exemplary embodiment, the CPU 5110 includes on-chip-cache 5111 and the GPU 5120 includes on-chip cache 5121. The NPU may also include an on-chip cache. In an exemplary embodiment, the CPU 5110 includes an off-chip cache 5112 and the GPU 5120 includes an off-chip cache 5122. Although not illustrated in FIG. 14, the NPU may also include an off-chip cache. In an exemplary embodiment, the off-chip cache 5112 may be internally connected to the CPU 5110, the GPU 5120, and the NPU through different buses. In an exemplary embodiment, the on-chip/off-chip caches include a volatile memory such as a dynamic random access memory (DRAM) and a static random access memory (SRAM), or a nonvolatile memory such as a NAND flash memory, a phase random access memory (PRAM), and a resistive random access (RRAM).

In an exemplary embodiment, main memories 5114 and 5124 are connected to the CPU 5110 and the GPU 5120 through corresponding memory controllers 5113 and 5123. In an embodiment, a main memory may be connected to the NPU through a memory controller. In an exemplary embodiment, memories 5116 and 5126 may be connected to the CPU 5110 and the GPU 5120 through bridges 5115 and 5125. In an embodiment, a memory may be connected to the NPU through a bridge. The bridges 5115 and 5125 (or the bridge of the NPU) may include memory controllers controlling the corresponding memories 5116 and 5126. In an exemplary embodiment, each of the bridges 5115 and 5125 (or the bridge of the NPU) may be implemented as a network device, a wireless network device, a switch, a bus, a cloud, or an optical channel.

In an exemplary embodiment, the memories 5124, 5126 include GPU memory. The GPU memory may maintain a command and data interacting with a GPU. The command and the data may be copied from the main memory or the storage. The GPU memory may store image data and have a higher bandwidth than the memory. The GPU memory may separate a clock from the CPU. The GPU may write image data the GPU memory after reading the image data from GPU memory and processing the read image data. The GPU memory may be configured to accelerate graphics processing.

In an exemplary embodiment, the memories 5134 and 5136 include an NPU memory. The NPU memory may be main memory for storing a command and data interacting with the NPU. The command and data may be copied from the main memory or the storage. The NPU memory may maintain weight data for a neural network. The NPU memory may have a higher bandwidth than the memory. The NPU memory may separate a clock from the CPU. The NPU may write the weight data to the NPU memory during training after reading the weight data from the NPU memory and updating the read weight data. The NPU memory may be configured to accelerate machine learning such as neural network training and inference.

In an exemplary embodiment, each of the main memories 5114, 5116, 5124, 5126, and 5210 may be implemented as a memory chip performing multi-phase clock generation described in FIGS. 1 to 9.

In an exemplary embodiment, the main memory includes a volatile memory such as a DRAM and an SRAM, or a nonvolatile memory such as a NAND flash memory, a PRAM, and an RRAM. The main memory has lower latency and lower capacity than each of the secondary storages 5210 and 5220.

The CPU 5110, GPU 5120, or NPU may access secondary storages 5210 and 5220 through the system bus 5001. The memory device 5210 may be controlled by the memory controller 5211. The memory controller 5211 may be connected to the system bus 5001. The storage device 5220 may be controlled by storage controller 5221. The storage controller 5221 may be connected to the system bus 5001.

The storage device 5220 may be implemented to store data. The storage controller 5221 may be implemented to read data from the storage device 5220 and to transmit the read data to the host. The storage controller 5221 may be implemented to store the transmitted data in the storage device 5220 in response to a host request. Each of the storage device 5220 and the storage controller 5221 may include a buffer storing metadata, reading a cache to store frequently accessed data, or storing a cache to improve write efficiency. For example, a write cache may receive and process a specific number of write requests. The storage device 5220 may include a volatile memory such as a hard disk drive (HDD) and a nonvolatile memory such as an NVRAM, an SSD, an SCM, and a new memory.

At least one embodiment of the present disclosure may be applied to a data server system.

Figure 15:
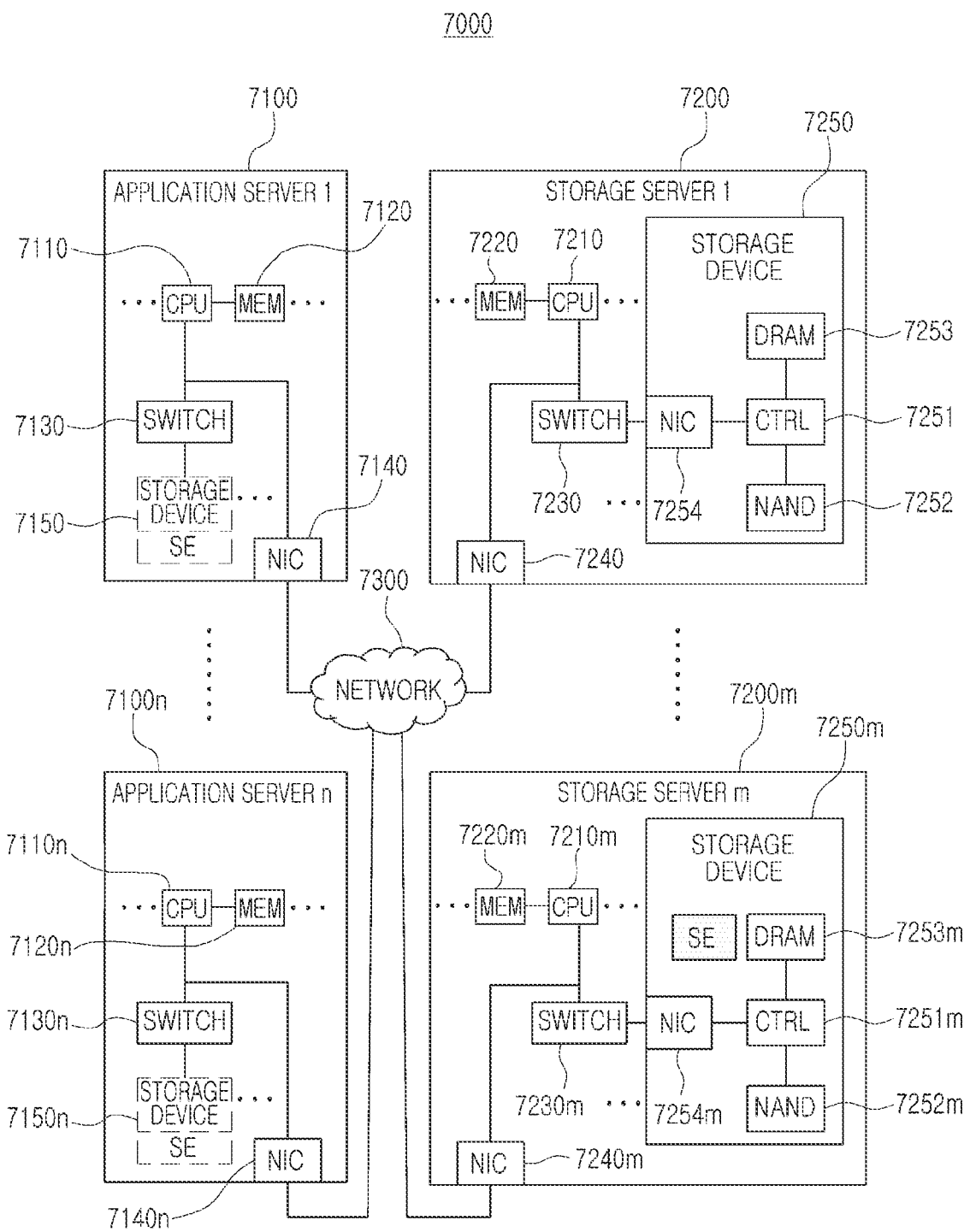
FIG. 15 is a block diagram of a data center to which a memory device according to an exemplary embodiment is applied.

FIG. 15 is a block diagram of a data center 7000 to which a memory device according to an exemplary embodiment is applied. Referring to FIG. 15, the data center 7000 is a facility for collecting various types of data and providing services, and may also be referred to as a data storage center. The data center 7000 may be a system for managing a search engine and a database, and may be a computing system used in a company such as a bank or an organization such as a government agency. The data center 7000 includes application servers 7100 to 7100n and storage servers 7200 to 7200m. The number of application servers 7100 to 7100n and the number of storage servers 7200 to 7200m may vary according to exemplary embodiments, and the number of application servers 7100 to 7100n and storage servers 7200 to 7200m may be different from each other.

An application server 7100 includes at least one processor 7110 and in at least one memory 7120. A storage server 7200 includes at least one processor 7210 and at least one memory 7220. As an example, the processor 7210 may control overall operation of the storage server 7200 and may access the memory 7220 to execute a command and/or data loaded in the memory 7220. The memory 7220 may be a double data rate synchronous DRAM (DDR SDRAM), a high bandwidth memory (HBM), a hybrid memory cube (HMC), a dual in-line memory module (DIMM), an optane DIMM, or a non-volatile DIMM (NVMDIMM).

The number of processors 7210 and memories 7220, included in the storage server 7200 may vary. In an exemplary embodiment, the processor 7210 and the memory 7220 provide a processor-memory pair. In an exemplary embodiment, the number of the processors 7210 and the number of the memories 7220 differ from each other. The processor 7210 may include a single-core processor or a multi-core processor. The description of the storage server 7200 may be similarly applied to the application server 7100. In an exemplary embodiment, the application server 7100 does not include the storage device 7150. The storage server 7200 may include at least one storage device 7250. The number of storage devices 7250 included in the storage server 7200 may vary according to exemplary embodiments. At least one of the storage devices 7150, 7250, 7150n, and 7150m may be implemented to divide a reference clock and to use the divided reference clocks as multi-phase clocks, as described in FIGS. 1 to 8.

Application servers 7100 to 7100n and storage servers 7200 to 7200m may communicate with each other through a network 7300. The network 7300 may be implemented using a fiber channel (FC) or an Ethernet. The FC may be a medium used for relatively high-speed data transmission and may employ an optical switch to provide high performance and/or high availability. The storage servers 7200 to 7200m may be provided as a file storage, a block storage, or an object storage depending on an access method of the network 7300.

In an exemplary embodiment, the network 7300 is a storage area network (SAN). For example, the SAN may be an FC-SAN using an FC network and implemented according to an FC protocol (FCP). As another example, the SAN may be an IP-SAN using a TCP/IP network and implemented according to a SCSI over TCP/IP or Internet SCSI (iSCSI) protocol. In an exemplary embodiment, the network 7300 is a general network such as a TCP/IP network. For example, the network 7300 may be implemented according to a protocol such as an FC over Ethernet (FCoE), a network attached storage (NAS), or an NVMe over Fabrics (NVMe-oF).

Hereinafter, a description will be given while focusing on the application server 7100 and the storage server 7200. The description of the application server 7100 may be applied to another application server 7100n, and the description of the storage server 7200 may be applied to another storage server 7200m.

The application server 7100 may store data, requested to be stored by a user or a client, in one of the storage servers 7200 to 7200m through the network 7300. In addition, the application server 7100 may obtain data, requested to be read by the user or the client, from one of the storage servers 7200 to 7200m through the network 7300. For example, the application server 7100 may be implemented as a web server or a database management system (DBMS).

The application server 7100 may access the memory 7120n or the storage device 7150n included in another application server 7100n through the network 7300, or may access the memories 7200 to 7200m or the storage devices 7250 to 7250m included in the memory 7220 to 7220m through the network 7300. Accordingly, the application server 7100 may perform various operations on data stored in the application servers 7100 to 7100n and/or storage servers 7200 to 7200*m*. For example, the application server 7100 may execute a command to move or copy data between the application servers 7100 to 7100*n* and/or storage servers 7200 to 7200*m*. In this case, the data may be moved from the storage servers 7200 to 7200*m* to the storage devices 7250 to 7250*m* through memories 7220 to 7220*m*, or may be directly moved to the memories 7120 to 7120*n* of the application servers 7100 to 7100*n*. Data moved through the network 7300, may be data encrypted for security or privacy.

In the storage server 7200, the interface 7254 may provide a physical connection between the processor 7210 and a controller 7251 and a physical connection between an NIC 7240 and the controller 7251. For example, the interface 7254 may be implemented by a direct attached storage (DAS) method in which the storage device 7250 is directly connected to an exclusive cable. In addition, for example, the interface 7254 may be implemented in various interface manners such as Advanced Technology Attachment (ATA), Serial ATA (SATA), external SATA (e-SATA), Small Computer Small Interface (SCSI), Serial Attached SCSI (SAS), Peripheral PCI Component Interconnection (PCI express), PCIe (NV express), NVMe (NVM express), IEEE 1394, universal serial bus (USB), secure digital (SD) card, multi-media card (MMC), embedded multi-media card (eMMC), Universal Flash Storage (UFS), Embedded Universal Flash Storage (eUFS), or Compact Flash (CF) card interface.

The storage server 7200 may further include a switch 7230 and an NIC 7240. The switch 7230 may selectively connect the processor 7210 and the storage device 7250 to each other or selectively connect the NIC 7240 and the storage device 7250 to each other under the control of the processor 7210.

In an exemplary embodiment, the NIC 7240 may include a network interface card or a network adapter. The NIC 7240 may be connected to the network 7300 by a wired interface, a wireless interface, a Bluetooth interface, or an optical interface. The NIC 7240 may include an internal memory, a DSP, or a host bus interface, and may be connected to the processor 7210 and/or the switch 7230 through a host bus interface. The host bus interface may be implemented as one of the above-described examples of the interface 7254. In an exemplary embodiment, the NIC 7240 may be integrated with at least one of the processor 7210, the switch 7230, and the storage 7250.

In the storage servers 7200 to 7200*m* or the application servers 7100 to 7100*n*, the processor may transmit data to the storage device 7130 to 7130*n* and 7250 to 7250*m* or transmit a command to the memory 7120 to 7120*n* and 7220 to 7220*m* to program or read the data. In this case, the data may be error-corrected through an error correction code (ECC) engine. The data is subjected to data bus inversion (DBI) or data masking (DM), and may include cyclic redundancy code (CRC) information. The data may be encrypted for security or privacy.

The storage device 7150 to 7150*m* and 7250 to 7250*m* may transmit a control signal and a command/address signal to the NAND flash memory devices 7252 to 7252*m* in response to a read command received from the processor. Accordingly, when data is read from the NAND flash memory device 7252 to 7252*m*, a read enable signal RE may be input as a data output control signal to serve to output data to a DQ bus. A data strobe DQS may be generated using the read enable signal RE. The command and the address signal may be latched in a page buffer according to a rising edge or a falling edge of a write enable signal WE.

The controller 7251 can control an overall operation of the storage device 7250. In an exemplary embodiment, the controller 7251 includes a static random access memory (SRAM). The controller 7251 may write data to the NAND flash 7252 in response to a write command, or may read data from the NAND flash 7252 in response to a read command. For example, the write command and/or the read command may be provided from the processor 7210 in the storage server 7200, the processor 7210*m* in another storage server 7200*m*, or the processors 7110 and 7110*n* in the application servers 7100 and 7100*n*. The DRAM 7253 may temporarily store (buffer) data to be written to the NAND flash 7252 or data read from the NAND flash 7252. In addition, the DRAM 7253 may store metadata. The metadata is user data or data generated by the controller 7251 to manage the NAND flash memory 7252. The storage device 7250 may include a secure element (SE) for security or privacy.

An external clock is divided to generate divided clocks and the divided clocks can be used to overcome an internal frequency limit of a high-speed DRAM. The divided clocks may include four phases to be recovered to the same frequency as the external clock on an output terminal. When a multi-phase clock is used, skew occurs between multiple phases. When the divided clocks are recovered to the same frequency as the external clock, a duty error occurs. Accordingly, an operation is required to accurately match a phase relationship between the multiple phases with 90 degrees. In at least one embodiment of the present disclosure, the duty error of the divided clocks is corrected by inputting the divided clocks to a duty detector to compensate for skew between zero degrees and 180 degrees (or skew between 90 degrees and 270 degrees), and the skew between zero degrees and 90 degrees may be corrected through a 90-degree phase shift using a ring oscillator to generate a multi-phase clock.

A multi-phase clock generator according to an exemplary embodiment of the inventive concept includes two duty detectors, a duty corrector, a clock tree, a timing controller, a half-phase skew corrector, and a 90-degree phase shifter. In an exemplary embodiment, a 90-degree phase clock is generated using a DLL output signal. In an exemplary embodiment, skew between zero degrees and 180 degrees is corrected by adjusting a slew rate of the duty error of the divided clocks, and the 90-degree clock and a 270-degree clock is generated using a 90-degree phase shift of the zero-degree clock. In an exemplary embodiment, a fixed delay line is a replica of a minimum delay before a variable delay line operates. In an exemplary embodiment, after a DLL is locked (including first duty error correction DCC0), a 90-degree phase clock is generated, and falling only DCC90 (second duty error correction) may be additionally performed.

In a multi-phase clock generator according to an exemplary embodiment, a memory device including the multi-phase clock generator, and a method of generating a multi-phase clock of the memory device described above, a duty between multi-phase divided clocks may be controlled while performing a DLL operation on a single-phase clock, and thus, a reliable multi-phase clock may be generated even in a small area.

While exemplary embodiments of the inventive concept have been shown and described above, it will be apparent to those skilled in the art that modifications and variations in these embodiments can be made without departing from the scope of the present inventive concept.

What is claimed is:

1. An operating method of a memory device, the method comprising:
    performing a delay locked loop operation to generate an in-phase clock corresponding to a reference clock;
    performing a phase shift operation to generate a quadrature-phase clock using the in-phase clock;
    performing a first phase split operation about the in-phase clock to generate a first phase clock and a third phase clock;
    performing a second phase split operation about the quadrature-phase clock to generate a second phase clock and a fourth phase clock;
    performing a first duty error correction between the first phase clock and the third phase clock; and
    performing a second duty error correction between the second phase clock and the fourth phase clock.

2. The method of claim 1, further comprising:
    receiving the reference clock from an external device.

3. The method of claim 1, wherein the performing the delay locked loop operation includes:
    performing a coarse locking operation using a first coarse delay line; and
    performing a fine locking operation using a first fine delay line.

4. The method of claim 3, wherein the fine locking operation is started after the coarse locking operation is completed.

5. The method of claim 3, wherein the fine locking operation is performed while the performing the first duty error correction.

6. The method of claim 3, wherein the first coarse delay line and the first fine delay line are fixed delay lines.

7. The method of claim 1, wherein the phase shift operation is performed using a second coarse delay line and a second fine delay line.

8. The method of claim 7, wherein the second coarse delay line and the second fine delay line are variable delay lines.

9. The method of claim 1, wherein the performing the phase shift operation includes generating the quadrature-phase clock using a ring oscillator.

10. The method of claim 1, wherein each of the performing the first and the second duty error corrections includes detecting duty error corresponding clocks and adjusting a skew corresponding to the detected duty error.

11. A memory device comprising:
    a delay locked loop circuit configured to receive a reference clock and to output an in-phase clock corresponding to the reference clock;
    a phase shifting circuit configured to receive the in-phase clock and to generate a quadrature-phase clock corresponding to the in-phase clock using a ring oscillator;
    a first phase splitter configured to receive the in-phase clock and to generate a first phase clock and a third phase clock;
    a second phase splitter configured to receive the quadrature-phase clock and to generate a second phase clock and a fourth phase clock;
    a first duty corrector configured to correct a first duty error between the first phase clock and the third phase clock; and
    a second duty corrector configured to correct a second duty error between the second phase clock and the fourth phase clock.

12. The memory device of claim 11, further comprising:
    a first duty detection circuit configured to detect the first duty error between the first phase clock and the third phase clock; and
    a second duty detection circuit configured to detect the second duty error between the second phase clock and the fourth phase clock.

13. The memory device of claim 11, wherein the phase shifting circuit includes a variable delay line.

14. The memory device of claim 13, wherein the variable delay line includes a first variable delay line and a second variable delay line,
    wherein the phase shifting circuit controls a phase of the first variable delay line according to a coarse code and a phase of second variable delay line according to a fine code.

15. The memory device of claim 14, wherein the phase shifting circuit includes a phase controller configured to generate the coarse code and the fine code.

16. A memory system comprising:
    a memory device; and
    a controller configured to control the memory device,
    wherein the memory device includes:
    a multi-phase clock generator configured to receive a reference clock from the controller and to generate an in-phase clock corresponding to the reference clock, a quadrature-phase clock corresponding to the in-phase clock, an inverted in-phase clock, and an inverted quadrature-phase clock;
    a first duty corrector configured to correct a first duty error between the in-phase clock and the inverted in-phase phase clock; and
    a second duty corrector configured to correct a second duty error between the quadrature-phase clock and the inverted quadrature-phase clock.

17. The memory system of claim 16, wherein the multi-phase clock generator includes:
    a delay locked loop circuit configured to receive a reference clock and to output a delayed clock; and
    a phase shifting circuit configured to receive the delayed clock and to generate a shifted phase clock.

18. The memory system of claim 17, wherein the multi-phase clock generator further includes:
    a first phase splitter configured to receive the delayed clock from the delay locked circuit and to generate the in-phase clock and the inverted in-phase clock; and
    a second phase splitter configured to receive the shifted phase clock from the phase shifting circuit and to generate the quadrature-phase clock and the inverted quadrature-phase clock.

19. The memory system of claim 17, wherein the multi-phase clock generator further includes:
    a first duty detection circuit configured to detect the first duty error between the in-phase clock and the inverted in-phase clock; and
    a second duty detection circuit configured to detect the second duty error between the quadrature-phase clock and the inverted quadrature-phase clock.

20. The memory system of claim 16, wherein each of the first duty corrector and the second duty corrector compensates a corresponding skew by adjusting a slew rate of duty error.

* * * * *